(12) United States Patent
Kang

(10) Patent No.: US 7,068,529 B2
(45) Date of Patent: *Jun. 27, 2006

(54) NONVOLATILE FERROELECTRIC MEMORY DEVICE

(75) Inventor: Hee Bok Kang, Daejeon (KR)

(73) Assignee: Hynix Semiconductor Inc., Ichon-shi (KR)

( * ) Notice: Subject to any disclaimer, the term of this patent is extended or adjusted under 35 U.S.C. 154(b) by 248 days.

This patent is subject to a terminal disclaimer.

(21) Appl. No.: 10/331,584

(22) Filed: Dec. 31, 2002

(65) Prior Publication Data

US 2004/0047173 A1    Mar. 11, 2004

(30) Foreign Application Priority Data

Sep. 6, 2002    (KR) .................. 10-2002-0053726

(51) Int. Cl.
G11C 11/00    (2006.01)
G11C 11/24    (2006.01)

(52) U.S. Cl. .................... 365/145; 365/149
(58) Field of Classification Search ............. 365/145, 365/149
See application file for complete search history.

(56) References Cited

U.S. PATENT DOCUMENTS 5,969,981 A * 10/1999 Kono .................. 365/145
5,999,438 A * 12/1999 Ohsawa ................ 365/149
6,421,268 B1   7/2002 Kato et al.
6,449,184 B1   9/2002 Kato et al.
6,574,135 B1 * 6/2003 Komatsuzaki ........... 365/145
6,700,812 B1 * 3/2004 Kang et al. ............ 365/145

FOREIGN PATENT DOCUMENTS

| JP | 11-40759 | 2/1999 |
| JP | 2000-40378 | 2/2000 |
| JP | 2001-222884 | 8/2001 |
| JP | 2002-93157 | 3/2002 |
| JP | 2002/157879 | 5/2002 |
| KR | 2000-34852 | 6/2000 |
| KR | 2001-27713 | 4/2001 |

* cited by examiner

Primary Examiner—Trong Phan
(74) Attorney, Agent, or Firm—Jacobson Holman PLLC

(57) ABSTRACT

The disclosed nonvolatile ferroelectric memory device comprises: a memory cell array including a plurality of memory cells connected to a plurality of wordlines and a plurality of platelines, respectively; a read control block configured to convert the data level voltage stored in the memory cell into a corresponding data bit value of a plurality of data bit values and output the converted value externally; and a write control block configured to write a plurality of bit data inputted externally as a corresponding data level voltage of a plurality of data level voltages in the memory cell, wherein bitlines are layered into main bitline and sub-bitline by reducing a current value corresponding to a sensing voltage of the sub-bitline at an initial level of the main bit line. As a result, the FRAM can write a plurality of data levels in one ferroelectric memory cell.

39 Claims, 25 Drawing Sheets

NONVOLATILE FERROELECTRIC MEMORY DEVICE

BACKGROUND OF THE INVENTION

1. Field of the Invention

The present invention generally relates to nonvolatile ferroelectric memory devices, and more specifically, to a nonvolatile ferroelectric memory device configured to store data of more than 2 bits in one memory cell by using multi-level voltages.

2. Description of the Prior Art

Generally, a ferroelectric random access memory (hereinafter, referred to as 'FeRAM') has attracted considerable attention as a next generation memory device because it has the same data processing speed as a DRAM and conserves data even after the power is turned off.

The FRAM includes capacitors similar to the DRAM, but the capacitors are made of a ferroelectric substance. The ferroelectric substance has the characteristic of a high residual polarization that data is not maintained even after an electric field applied thereto is eliminated.

FIG. 1 is a characteristic curve illustrating a hysteresis loop of a general ferroelectric substance.

As shown in FIG. 1, a predetermined amount of current P ('d' or 'a' state) is maintained even after the electric field V is cleared due to existence of a residual (or spontaneous) polarization.

These 'd' and 'a' states may be assigned to binary values of '1' and '0' for using the ferroelectric substance as a memory cell.

FIG. 2 is a structural diagram illustrating a unit cell of the FRAM device.

As shown in FIG. 2, the unit cell of the conventional FRAM is provided with a bitline BL arranged in one direction and a wordline WL arranged in another direction vertical to the bitline BL. A plateline PL is arranged parallel to the wordline and spaced at a predetermined interval. The unit cell is also provided with a transistor T having a gate connected to an adjacent wordline WL and a source connected to an adjacent bitline BL, and a ferroelectric capacitor FC connected between a source of the transistor T and a plateline PL.

FIG. 3 is a block diagram illustrating the structure of the conventional nonvolatile ferroelectric memory device.

The conventional nonvolatile ferroelectric memory device comprises a memory cell array 1 including a plurality of memory cells, a wordline driver 2 configured to apply a driving signal to a wordline of the memory cell array and a sense amplifier array 3 including a plurality of sense amplifiers configured to sense and amplify data stored in a memory cell of the memory cell array 1.

The sense amplifier array 3 comprising a plurality of sense amplifiers amplifies data in bitlines.

FIG. 4 is a detail circuit diagram illustrating the memory cell array of the conventional nonvolatile ferroelectric memory device.

The memory cell array 1 has a folded bitline structure like that of DRAM.

A unit memory cell MC0, MC1, . . . , MCn comprises a transistor T0 and a ferroelectric capacitor FC0.

The transistor T0, T1, . . . , Tn has a control electrode connected to a wordline WL0, WL1, . . . , WLn and a drain electrode connected to a bitline BL0, BL1.

The ferroelectric capacitor FC0, FC1, . . . , FCn is connected between a plateline PL0, PL1, . . . PLn and a source of the transistor T0, T1, . . . , Tn.

The data input/output operation of the conventional FRAM is described referring to the attached drawings.

FIG. 5a is a timing diagram illustrating a write mode operation of the conventional nonvolatile ferroelectric memory device.

Referring to FIG. 5a, when a chip enable signal CEB and a write enable signal are enabled from a high level to a low level, a write mode operation is entered.

Next, an inputted address is decoded and its corresponding wordline WL is enabled. In other words, a potential of the wordline WL transits from the low level to the high level, thereby selecting the cell.

In this way, while the wordline is held at the high level, a high level signal of a predetermined interval and a low level signal of a predetermined interval are sequentially applied to a plate line PL.

In order to write a binary logic value "1" or "0" in the selected cell, data DIN of high or low levels synchronized to the write enable signal are applied to the corresponding bitline BL.

In other words, during a bitline BL and a wordline WL at the high level, if a low level signal is applied to a plateline PL, a logic value of "1" is written in the ferroelectric capacitor FC0 of FIG. 4.

If a low level signal is applied to the bitline BL and a high level signal is applied to the plateline PL, a logic value of "0" is written in the ferroelectric capacitor FC0 of FIG. 4.

FIG. 5b is a timing diagram illustrating a read mode operation of the conventional nonvolatile ferroelectric memory device.

Referring to FIG. 5b, when the chip enable signal CEB transits from a high level to low level, all bitlines BL0.about.BLn are equalized to the low level by an equalization signal.

After each bitline BL0~BLn is activated, an address is decoded and the required wordline is enabled by the decoded address, thereby selecting a corresponding unit cell.

A high level signal is applied to a plateline PL of the selected cell to destroy a data corresponding to the logic value "1" stored in the ferroelectric capacitor FC0 of the memory cell. If the logic value "0" is stored in the ferroelectric capacitor FC0, a corresponding data will not be destroyed.

The destroyed or non-destroyed data DOUT are outputted according to the hysteresis loop characteristics. As a result, a sense amplifier senses a logic value "1" or "0".

As shown in the hysteresis loop of FIG. 1, the state moves from 'd' to 'f' when the data is destroyed, while the state moves from 'a' to 'f' when the data is not destroyed.

As a result, a sense amplifier enable signal SEN is activated after a predetermined time to enable the sense amplifier. Then, when the data is destroyed, the sense amplifier amplifies the data to output a logic value "0".

After the sense amplifier amplifies the data, the data should be recovered into the original data. Accordingly, when the high signal is applied to a corresponding wordline WL0, the plateline is disabled from the high level to the low level.

However, as the FRAM has an increasing degree of integration, design rule of the FRAM decreases. As a result, it is difficult to maintain characteristics of the cell as the cell size decreases.

In a cell having small size, data read/write operations may not be normally performed, thereby causing mis-operations of the FRAM.

SUMMARY OF THE INVENTION

Accordingly, it is an object of the present invention to provide a nonvolatile ferroelectric memory device configured to store a multi-level of data in one cell.

In order to achieve the above-described object, the disclosed nonvolatile ferroelectric memory device includes a memory cell array having a plurality of memory cells connected to a plurality of wordlines and platelines;

a read control block configured to convert the data stored in the memory cell into a multi bit data value and output the converted value externally; and a write control block configured to store a multi bit data inputted externally as a corresponding voltage level voltage in the memory cell.

BRIEF DESCRIPTION OF THE DRAWINGS

The present invention will be described in terms of several embodiments to illustrate its broad teachings. Reference is also made to the attached drawings.

DETAILED DESCRIPTION OF THE PREFERRED EMBODIMENTS

The present invention will be described in more detail referring to the accompanying drawings.

Figure 1:
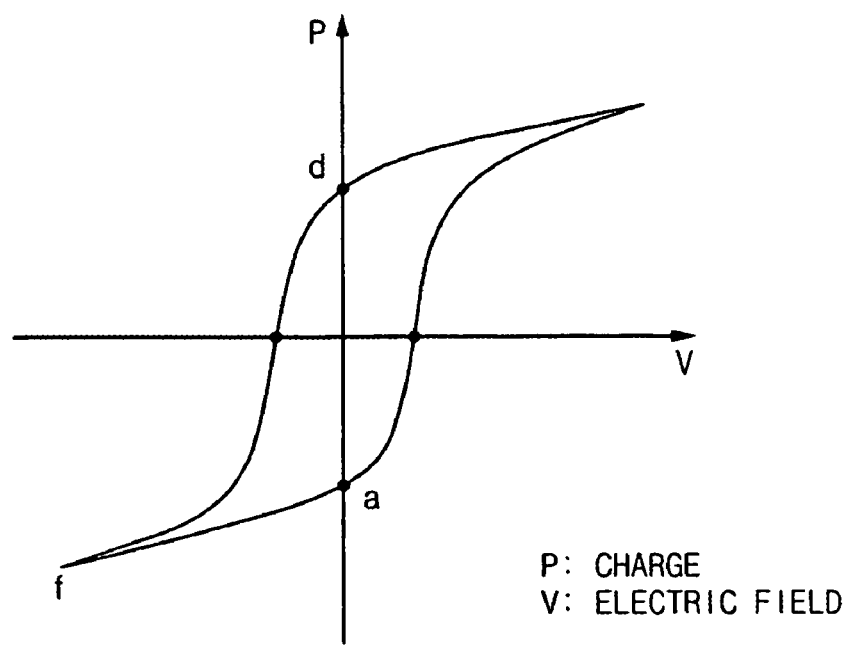
FIG. 1 is a characteristic curve showing a hysteresis loop of a general ferroelectric material.
Figure 2:
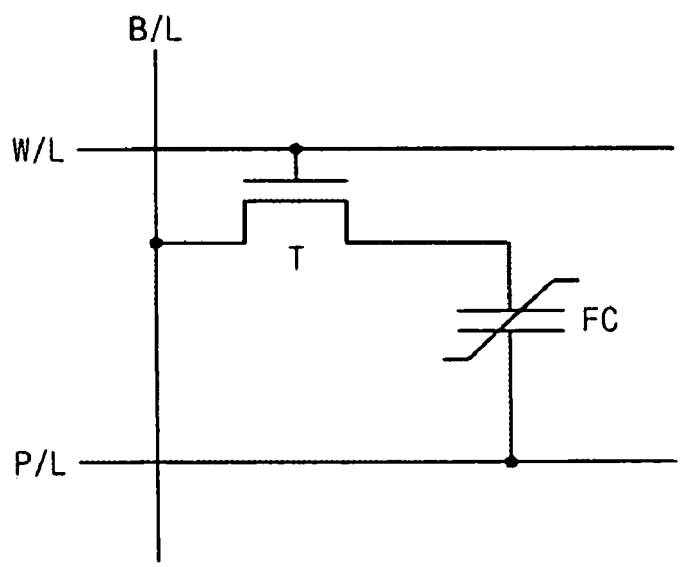
FIG. 2 is a structural diagram showing a unit cell in a conventional nonvolatile ferroelectric memory device.
Figure 3:
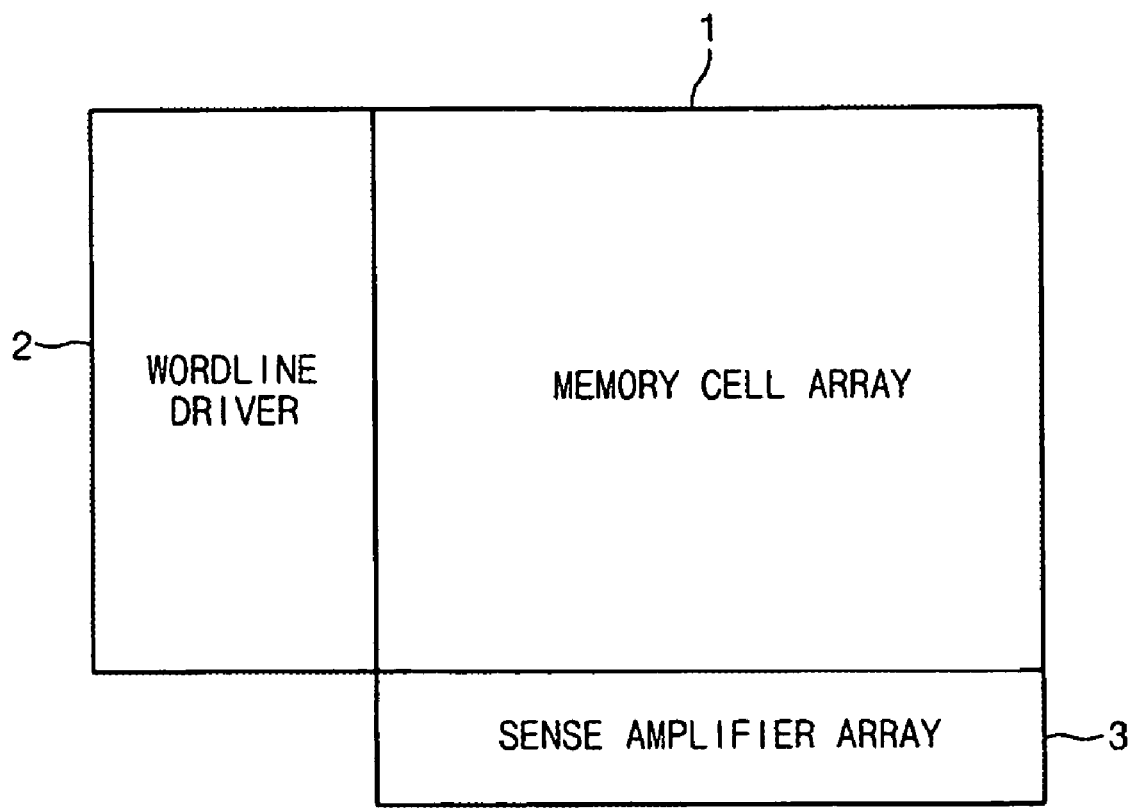
FIG. 3 is a block diagram illustrating the structure of the conventional nonvolatile ferroelectric memory device.
Figure 4:
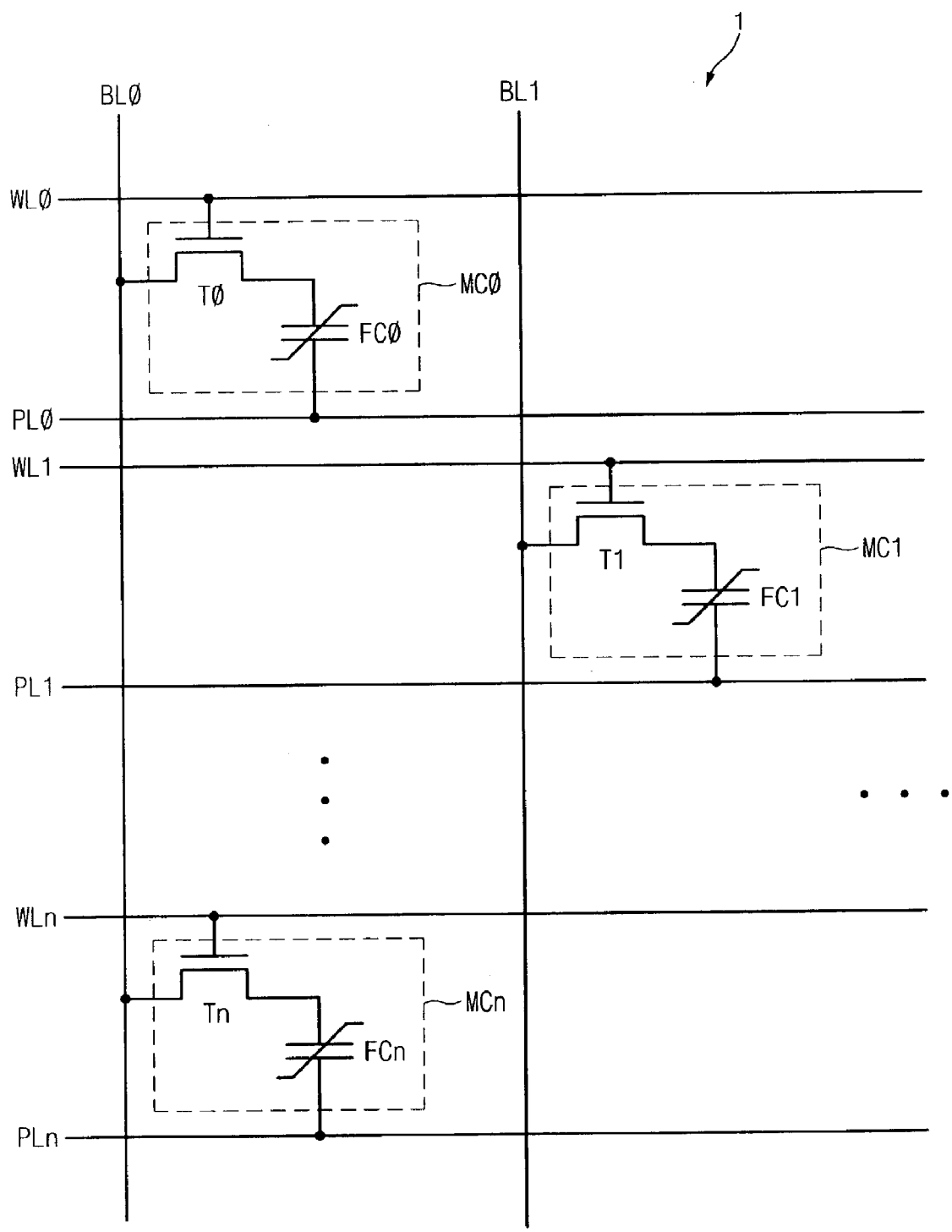
FIG. 4 is a detail circuit diagram illustrating a memory cell array of the conventional nonvolatile ferroelectric memory device.
Figure 5A:
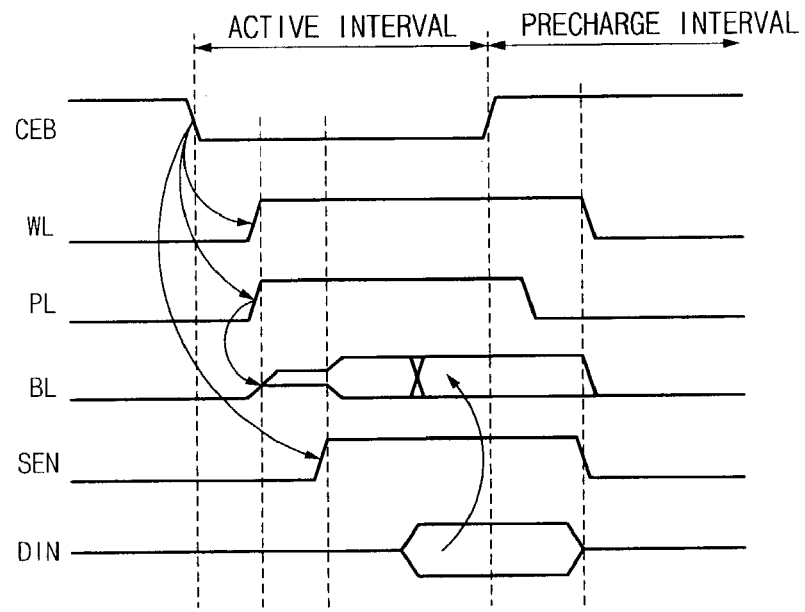
FIG. 5a is a timing diagram illustrating a write mode operation of the conventional nonvolatile ferroelectric memory device.
Figure 5B:
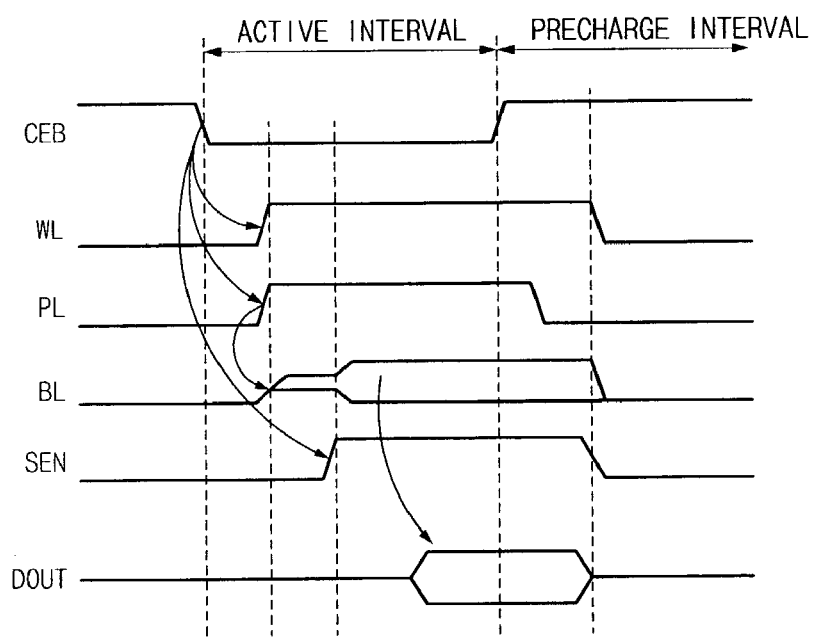
FIG. 5b is a timing diagram illustrating a read mode operation of the conventional nonvolatile ferroelectric memory device.
Figure 6:
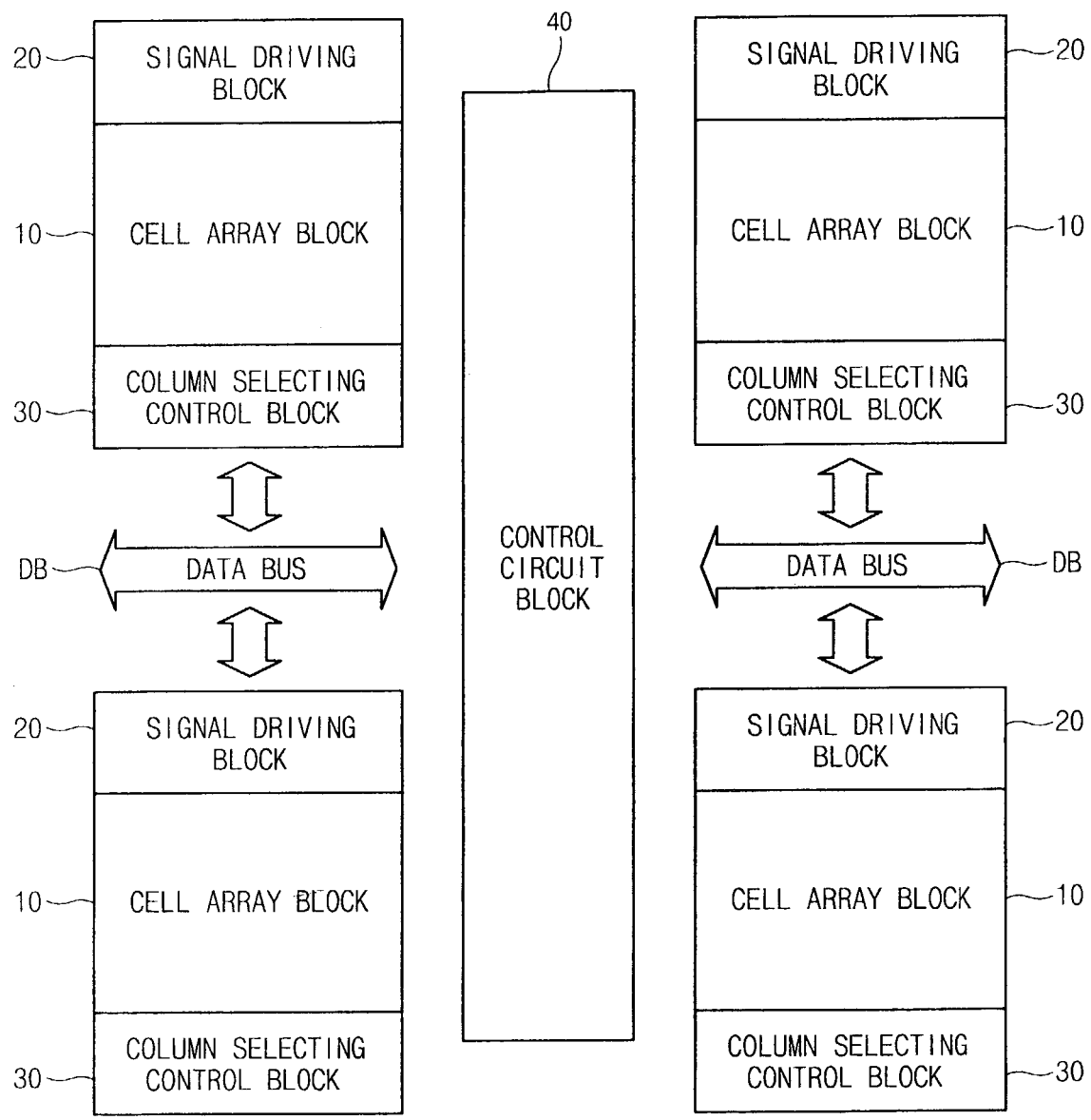
FIG. 6 is a block diagram illustrating a nonvolatile ferroelectric memory device according to the present invention.

FIG. 6 is a block diagram illustrating a nonvolatile ferroelectric memory device according to the present invention.

The disclosed nonvolatile ferroelectric memory device comprises a cell array block 10 including a plurality of memory cells. A signal driving block 20 is configured to drive signals for controlling a cell operation. A column selecting control block 30 is configured to select a corresponding main bitline according to a column address. The signal driving block 20 and the column selecting control block 30 are symmetrically positioned at both sides of the cell array block 10.

The cell array block 10, the signal driving block 20 and the column selecting control block 30 are arranged in four regions, respectively. A control circuit block 40 including control circuits such as control signal generating circuit, buffer, decoder and sense amplifier array is vertically positioned in the middle of the FRAM. Data buses DB are positioned in parallel between each cell array block divided by the control circuit block 40. The data bus DB is configured to transmit data of a main bitline selected by the column selecting control block 30 into the control circuit block 40 or transmit data inputted in the control circuit block 40 into the cell array block 10.

The column selecting control blocks 30 are arranged toward the data buses DB, respectively.

Figure 7:
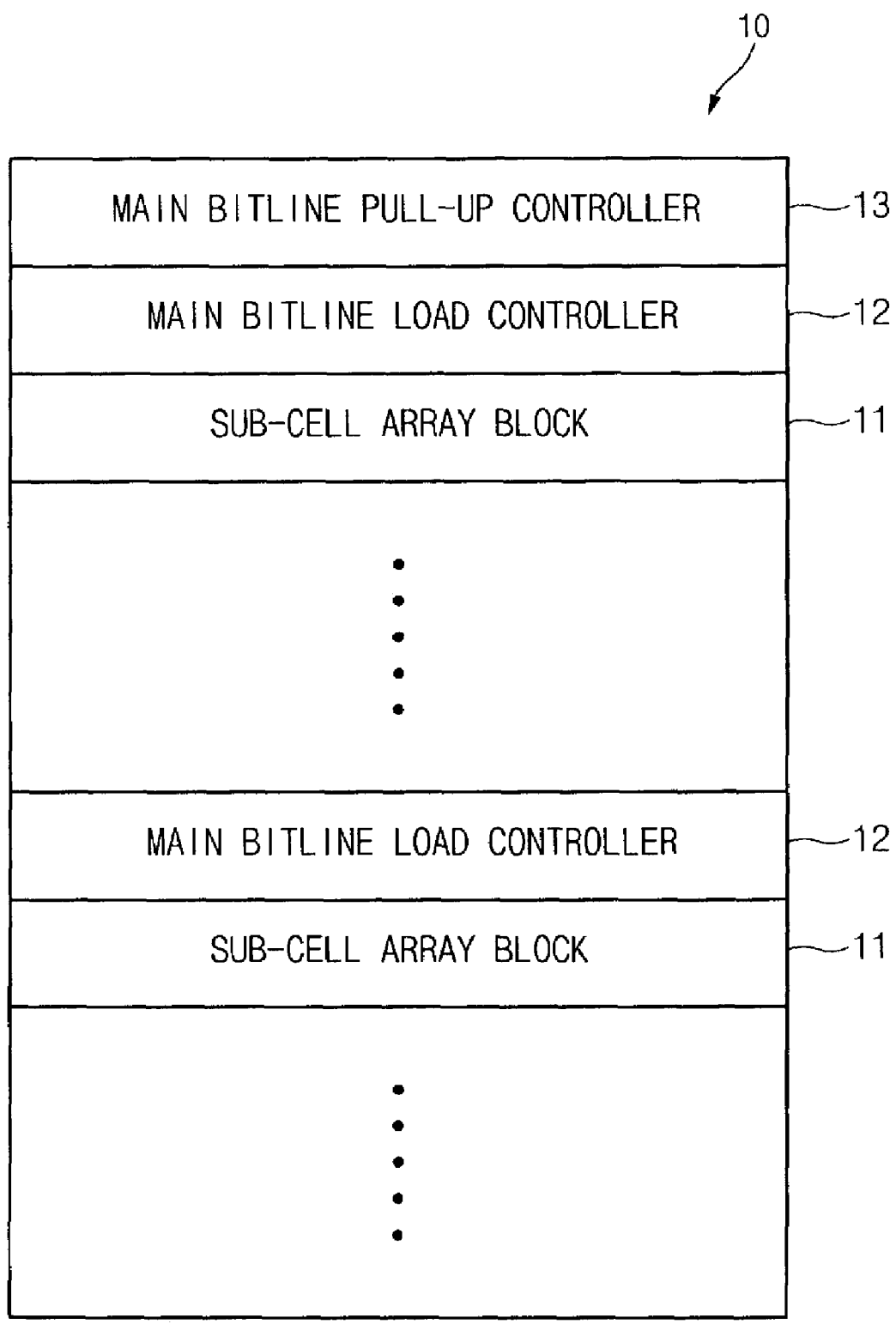
FIG. 7 is a block diagram illustrating a cell array block in the nonvolatile ferroelectric memory device of FIG. 6.

FIG. 7 is a block diagram illustrating a cell array block in the nonvolatile ferroelectric memory device of FIG. 6.

The cell array block 10 comprises a plurality of sub-cell array blocks 11. Here, a main bitline load controller 12 is allotted to every predetermined number of sub-cell array blocks 11 in order to constantly maintain load of a main bitline (not shown).

A bitline of the cell array block 10 comprises a main bitline and a sub-bitline. The sub-cell array blocks 11 have sub-bitlines, respectively, connected to the same main bitline.

Additionally, the cell array block 10 has a main bitline pull-up controller 13 configured to pull up a main bitline (not shown) to a high level.

Figure 8:
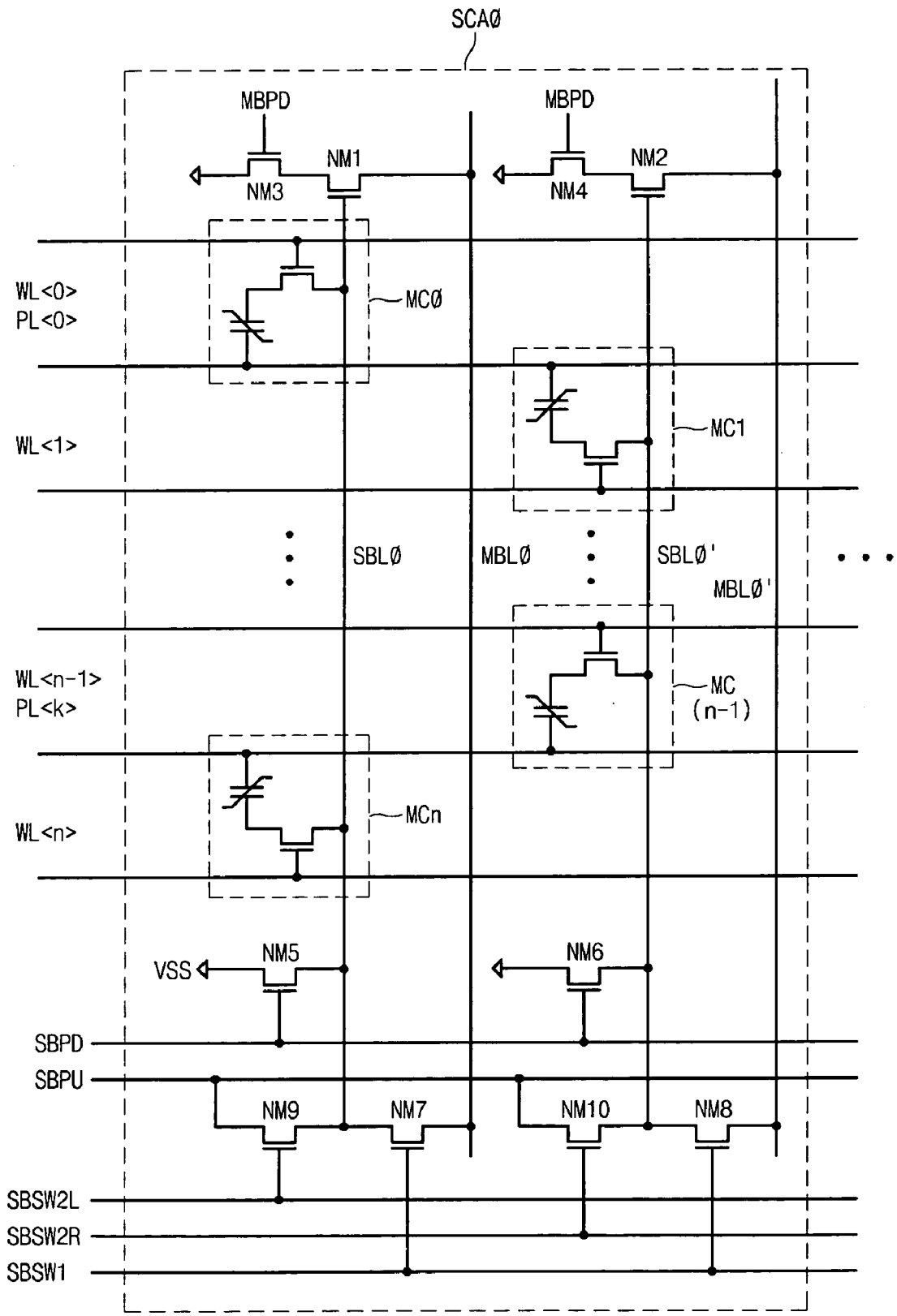
FIG. 8 is a detail circuit diagram illustrating a sub-cell array block of FIG. 7.

FIG. 8 is a detail circuit diagram illustrating a sub-cell array block of FIG. 7. Here, the sub-cell array block has a folded bitline structure.

The sub-cell array block 11 comprises a plurality of unit sub-cell array blocks SCA0~SCAn.

The unit sub-cell array block SCA0 includes a plurality of memory cells MC0~MCn alternatively connected to two sub-bitlines SBL0 and SBL0'. A plateline PL0 is shared in two memory cells MC0 and MC1 connected to wordlines WL0 and WL1, respectively.

The unit sub-cell array block SCA0 includes current regulating NMOS transistors NM1 and NM2, and main bitline pull-down NMOS transistors NM3 and NM4. The current regulating NMOS transistors NM1 and NM2 connected in series between a main bitline MBL0 and a ground voltage VSS regulate a current of the main bitline MBL0 according to the sub-bitlines SBL0 and SBL0'. The main bitline pull-down NMOS transistors NM3 and NM4 transmit a current transmitted from the NMOS transistors NM1 and NM2 into the ground voltage VSS according to a main bitline pull-down signal MBPD.

The unit sub-cell array block SCA0 includes pull-down NMOS transistors NM5 and NM6, switch NMOS transistors NM7 and NM8, and sub-bitline pull-up NMOS transistors NM9 and NM10. The pull-down NMOS transistors NM5 and NM6 set the sub-bitlines SBL0 and SBL0' at the ground voltage VSS according to a sub-bitline pull-down signal SBPD. The switch NMOS transistors NM7 and NM8 selectively transmit data of the main bitline MBL0 into the sub-bitlines SBL0 and SBL0' according to a switch control signal SBSW1. The sub-bitline pull-up NMOS transistors NM9 and NM10 pull up the sub-bitlines SBL0 and SBL0' to a potential of a sub-bitline pull-up signal SBPU according to switch control signals SBSW2L and SBSW2R.

Figure 9:
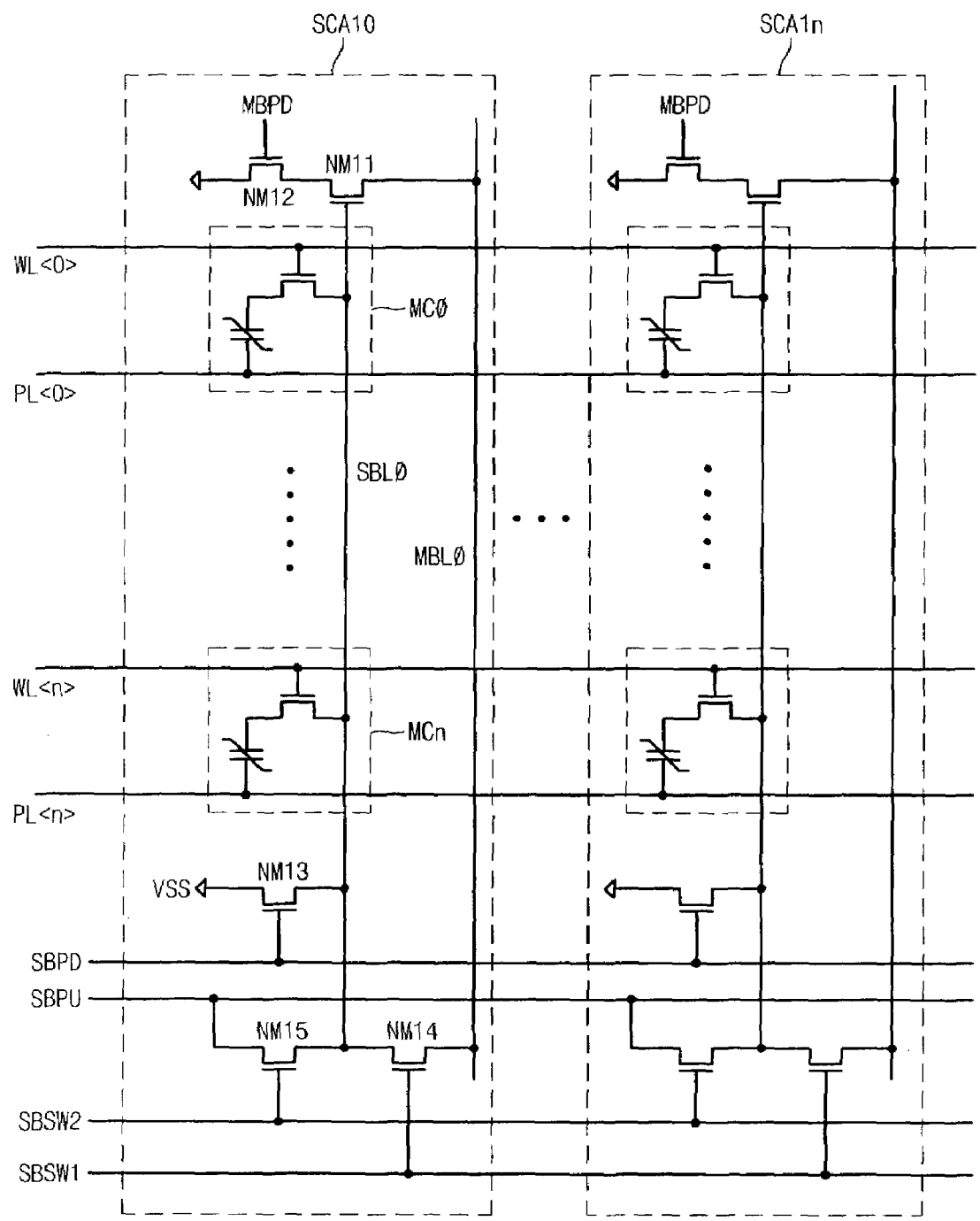
FIG. 9 is a detail circuit diagram illustrating a sub-cell array block of FIG. 7 in accordance with another preferred embodiment.

FIG. 9 is a detail circuit diagram illustrating a sub-cell array block 11 of FIG. 7 in accordance with another preferred embodiment. Here, the sub-cell array block 11 has an open bitline structure.

The sub-cell array block 11 comprises a plurality of unit sub-cell array blocsk SCA10~SCA1n.

The unit sub-cell array block SCA10 comprises a plurality of unit cells MC0~MCn connected to wordlines WL0~WLn and PL0~PLn. The plurality of unit cells MC0~MCn are connected to the same sub-bitline SBL0.

The unit sub-cell array block SCA10 includes a current regulating NMOS transistor NM11 and a main bitline pull-down NMOS transistor NM12. The current regulating NMOS transistor NM11 connected in series between main bitline MBL0 and ground voltage VSS regulates a current of the main bitline MBL0 according to a voltage of the sub-bitline SBL0. The main bitline pull-down NMOS transistor NM12 transmits a current transmitted from the NMOS transistor NM11 into the ground voltage VSS according to a main bitline pull-down signal MBPD.

The unit sub-cell array block SCA10 includes a pull-down NMOS transistor NM13, a switch NMOS transistor NM14 and a sub-bitline pull-up NMOS transistor NM15. The pull-down NMOS transistor NM13 sets up the sub-bitline SBL0 at a ground voltage VSS according to a sub-bitline pull-down signal SBPD. The switch NMOS transistor NM14 selectively transmits data of the main bitline MBL0 into the sub-bitline SBL0 according to a switch control signal SBSW1. The sub-bitline pull-up NMOS transistor NM15 pulls up the sub-bitline SBL0 to a potential of a sub-bitline pull-up signal SBPU according to a switch control signal SBSW2.

The reset unit sub-cell array blocks SCA11~SCA1n are configured to have the same structure as the unit sub-cell array block SCA10.

The main bitline MBL0 is connected to one sub-bitline SBL0 among a plurality of sub-bitlines SBL0~SBLn in one cell operation.

In other words, loads of the whole bitlines can be reduced to a load of one sub-bitline SBL0 by activating one sub-bitline among a plurality of sub-bitlines SBL0~SBLn.

Figure 10:
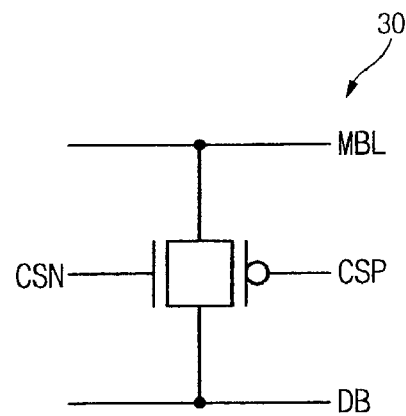
FIG. 10 is a detail circuit diagram illustrating a column selecting control block in the nonvolatile ferroelectric memory device.

FIG. 10 is a detail circuit diagram illustrating a column selecting control block in the nonvolatile ferroelectric memory device. Here, the column selecting control circuit connected to one main bitline MBL is shown for example. However, each column selecting control circuit of FIG. 10 is connected to a plurality of main bitlines MBL0~MBLn.

A column selecting control circuit of the column selecting control block 30 includes a transmission gate configured to be controlled by column selecting control signals CSN and CSP and selectively transmit data of the main bitline MBL into a data bus DB.

Figure 11:
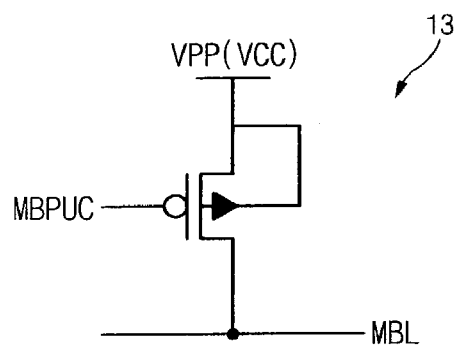
FIG. 11 is a detail circuit diagram illustrating a main bitline pull-up control unit of FIG. 7.

FIG. 11 is a detail circuit diagram illustrating the main bitline pull-up control unit of FIG. 7.

The main bitline pull-up controller 13 includes a pull-up PMOS transistor configured to apply a boosting voltage VPP or a power voltage VCC to a main bitline MBL according to a main bitline pull-up control signal MBPUC.

The pull-up PMOS transistor of the main bitline pull-up controller 13 pulls up the main bitline MBL to a boosting voltage VPP or a power voltage VCC during a precharge.

Figure 12:
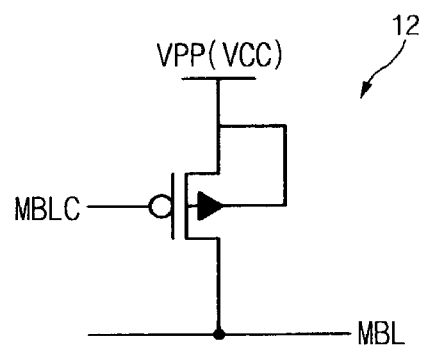
FIG. 12 is a detail circuit diagram illustrating a main bitline load control unit of FIG. 7.

FIG. 12 is a detail circuit diagram illustrating the main bitline load control unit of FIG. 7.

The main bitline load controller 12 has a load PMOS transistor configured to serve as load, that is, resistance connected between a main bitline MBL and a boosting voltage VPP or a power voltage VCC according to a main bitline control signal MBLC. The PMOS transistor of the main bitline load controller 12 driven as load is operated to control a current flowing in the main bitline MBL.

Figure 13:
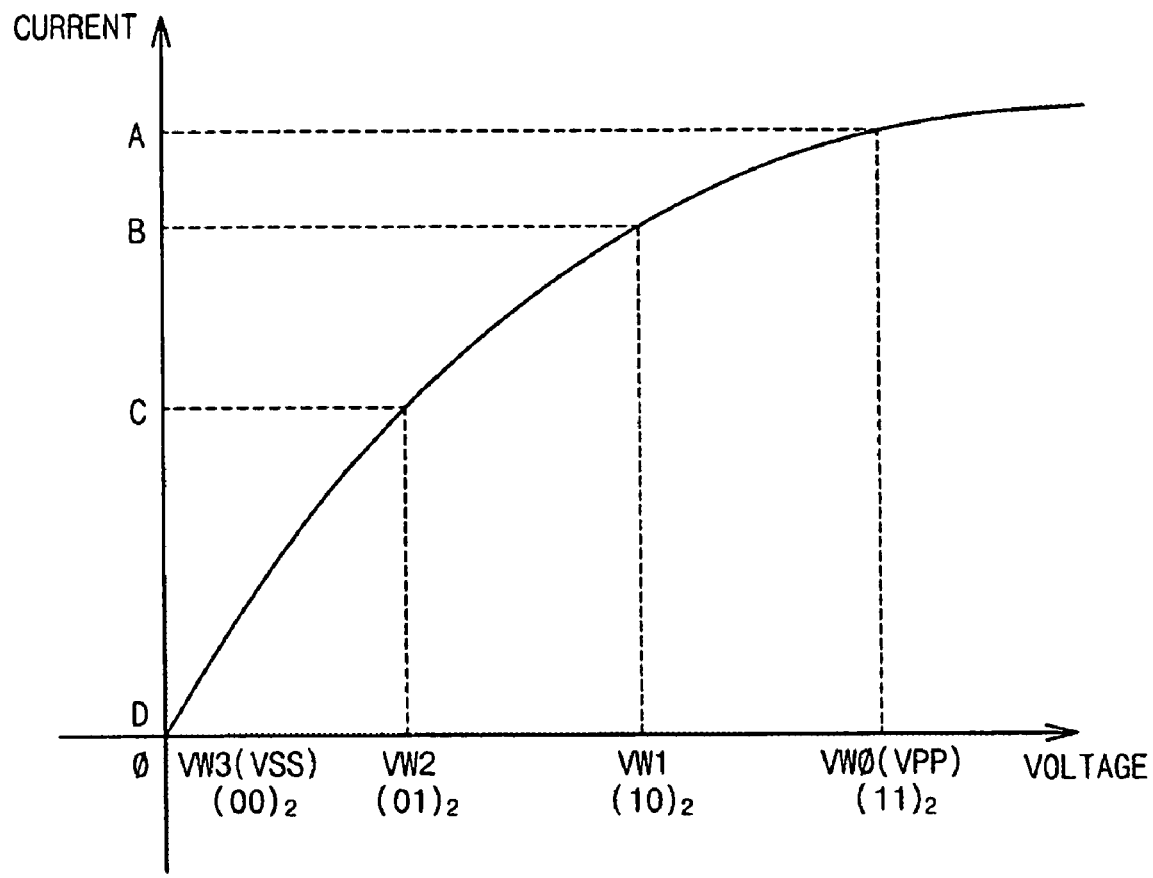
FIG. 13 is a graph illustrating the amount of current stored in a memory cell of the nonvolatile ferroelectric memory device according to multi-voltage level.

FIG. 13 is a graph illustrating the amount of current stored in a memory cell of the nonvolatile ferroelectric memory device according to multi-voltage level. Here, data of 2 bit is stored in one memory cell.

Four voltage levels VW0 (VPP), VW1, VW2 and VW3 (VSS) are required to store data of 2 bit in one memory cell MC. In other words, levels A, B, C and D corresponding to data of 2 bit $(00)_2$, $(01)_2$, $(10)_2$ and $(11)_2$ should be determined.

As a result, the amount of current corresponding to each voltage level should be stored to output the determined level.

Figure 14:
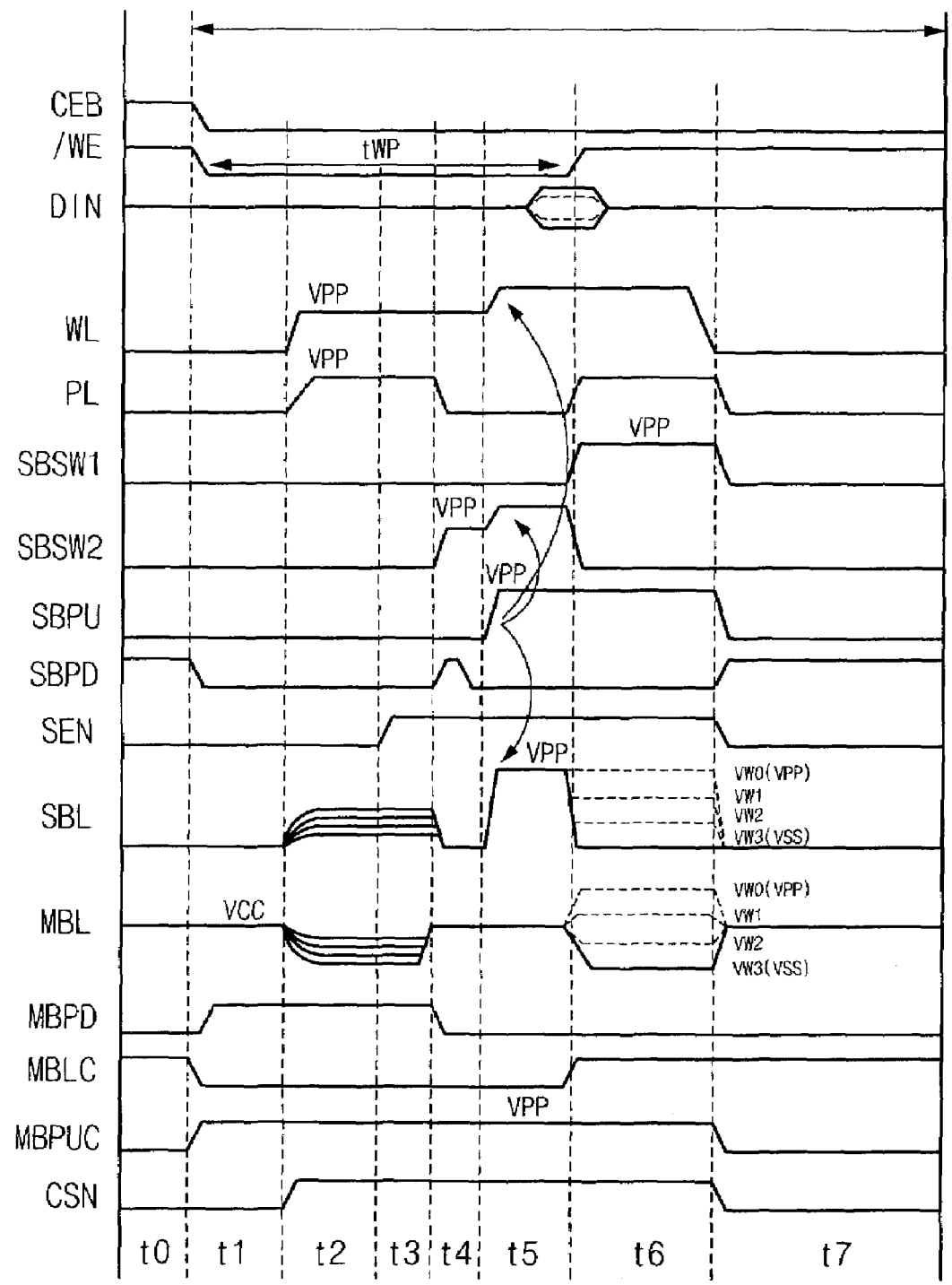
FIG. 14 is a timing diagram illustrating a write method of writing a voltage corresponding to data level in a unit cell of the nonvolatile ferroelectric memory device according to the present invention.

FIG. 14 is a timing diagram illustrating a write method of writing a voltage corresponding to data level in a unit cell of the nonvolatile ferroelectric memory device according to the present invention.

First, a sub-bitline SBL is precharged to the ground voltage VSS, and a main bitline MBL is prechraged to the power voltage VCC (t0, t1).

Subsequently, a boosting voltage VPP is applied to a wordline WL and a plateline PL, and data stored in a unit cell MC is transmitted to the sub-bitline SBL.

CEB is a chip enable signal. /WE is a write enable signal and performs a write operation in a low level of tWP. As described above with respect to other figures, MBLC is a main bit line control signal, and CSN is a column selecting control signal.

Here, a voltage level of the main bitline MBL decreases by a voltage level of the sub-bitline because a main bitline pull-down signal MBPD is at the high level.

If the voltage level of the main bitline MBL decreases sufficiently, a sense amplifier enable signal SEN becomes at the high level. Then, a level of the main bitline MBL is amplified by a sense amplifier (t3).

If data of the main bitline MBL is sufficiently amplified by the sense amplifier, a sub-bitline pull-down signal SBPD becomes at the high level and the sub-bitline SBL is pulled-down to the ground voltage VSS. The main bitline MBL is pulled-up to the power voltage VCC because a main bitline pull-up signal MBPUC is held at a boosting voltage VPP level (t4). Here, the plate line PL transits to the ground voltage VSS.

While a sub-bitline switch signal SBSW2 is held at a boosting voltage VPP level, if a sub-bitline pull-up signal SBPU transits to the boosting voltage VPP level, the level of the sub-switch signal SBSW2 is boosted to a voltage higher than a boosting voltage VPP because of self-boosting effect. As a result, a voltage level of the sub-bitline SBL increases to the boosting voltage VPP level.

While the wordline WL is held at the boosting voltage VPP level, the sub-bitline SBL becomes the boosting voltage VPP level and the wordline WL is boosted to a voltage higher than the boosting voltage VPP because of self-boosting effect. As a result, since the plateline PL is held at the ground voltage VSS and the wordline WL is boosted to a voltage higher than the boosting voltage VPP, a boosting voltage VPP corresponding to data level $(11)_2$ is stored in a capacitor FC in each unit cell MC (hidden "1 (VPP)" write) (t5).

Next, if data DIN having data level $(10)_2$ is inputted, the main bitline MBL becomes a voltage level VW1 corresponding to data level $(10)_2$, and a sub-bitline switch signal SBSW1 transits to the boosting voltage VPP. Then, the sub-bitline SBL becomes a voltage level VW1 corresponding to data level $(10)_2$ of the main bitline. The voltage level VW1 corresponding to data level $(10)_2$ is stored in the capacitor FC of the unit cell MC (write operation) (t6). Here, the reset memory cells MC, which are not selected, re-stores previous data (restoration operation).

Then, the sub-bitline SBL is precharged to the ground voltage VSS, and the main bitline MBL is precharged to the power voltage VCC (t7).

The above-described procedure is repeated when the rest data levels $(01)_2$ and $(00)_2$ are stored in memory cells MC.

Figure 15:
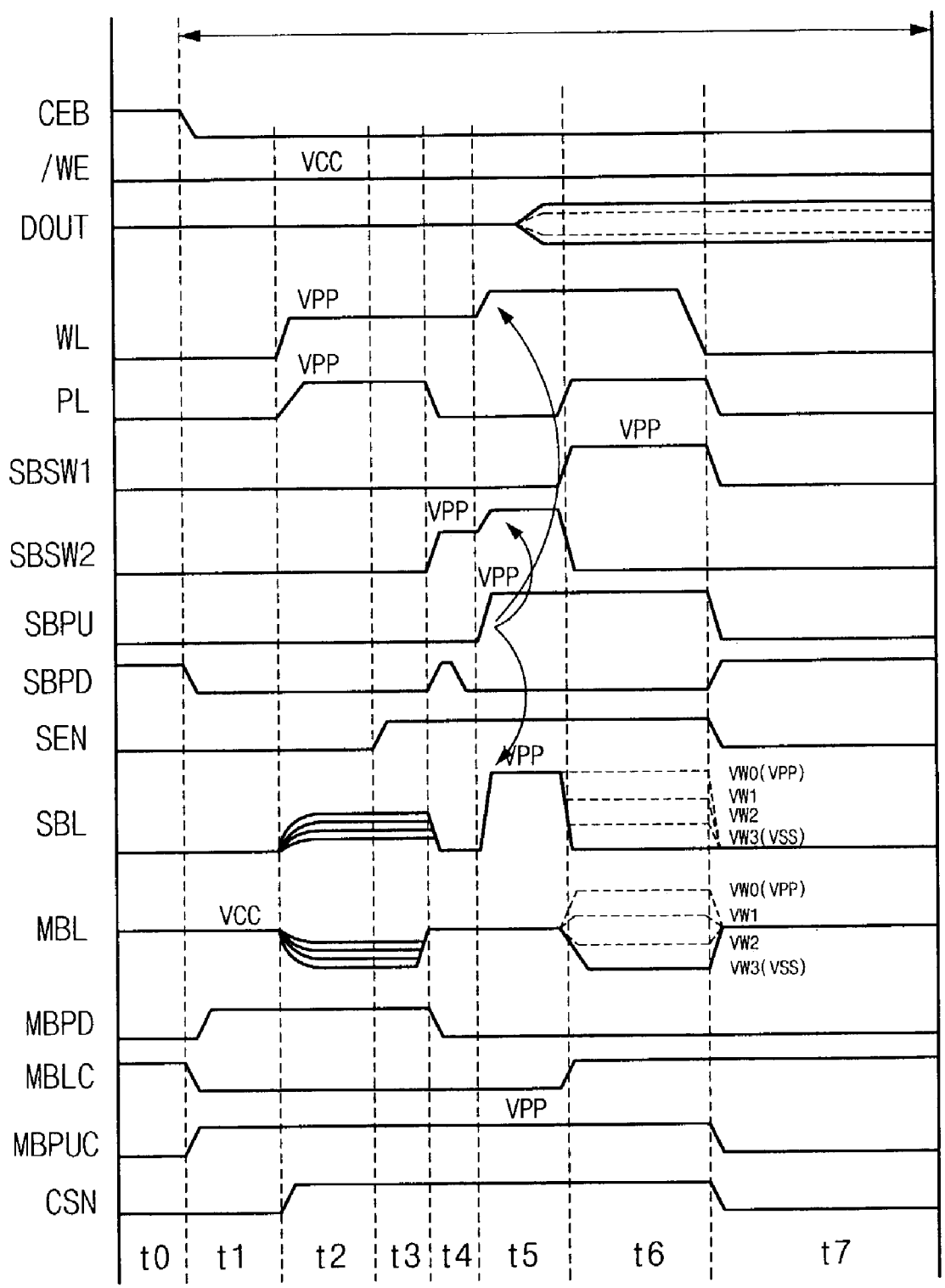
FIG. 15 is a timing diagram illustrating a read method of reading a voltage corresponding to data level written in the memory cell of the nonvolatile ferroelectric memory device according to the present invention.

FIG. 15 is a timing diagram illustrating a read method of reading a voltage corresponding to data level written in the memory cell of the nonvolatile ferroelectric memory device according to the present invention.

As described above with respect to other figures, CEB is a chip enable signal. /WE is a write enable signal and performs a write operation in a low level of tWP. As described above with respect to other figures, MBLC is a main bit line control signal, and CSN is a column selecting control signal.

First, the sub-bitline SBL is precharged to the ground voltage VSS, and the main bitline MBL is precharged to the power voltage VCC (t0, t1).

Subsequently, the boosting voltage VPP is applied to the wordline WL and the plateline PL. Data stored in the memory cell MC is transmitted to the sub-bitline SBL.

Here, the level of the main bitline MBL decreases by a voltage level of the sub-bitline SBL because a main bitline pull-down signal MBPD is at the high level (t2).

If the level of the main bitline MBL sufficiently decreases, a sense amplifier enable signal SEN becomes at the high level. The voltage level of the main bitline MBL is amplified by the sense amplifier (t3).

If data of the main bitline MBL is sufficiently amplified by the sense amplifier, the data is externally outputted via an input/output bus IO.

After the data of the main bitline MBL is sufficiently amplified by the sense amplifier, a sub-bitline pull-down signal SBPD becomes at the high level and the sub-bitline SBL is pulled-down to the ground voltage VSS. The main bitline MBL is pulled-up to the power voltage VCC because a main bitline pull-up signal MBPUC is held at the boosting voltage VPP level (t4). Here, the plateline PL transits to the ground voltage VSS.

While a sub-bitline switch signal SBSW2 is held at the boosting voltage VPP, if a sub-bitline pull-up signal SBPU transits to the boosting voltage VPP level, a voltage level of the sub-switch signal SBSw2 is boosted to a voltage higher than the boosting voltage VPP because of self-boosting effect. As a result, a voltage level of the sub-bitline SBL increases to the boosting voltage VPP level While the wordline WL is held at the boosting voltage VPP level, a voltage level of the sub-bitline SBL becomes at the boosting voltage VPP level, and a voltage level of the wordline WL is boosted to a voltage higher than the boosting voltage VPP because of self-boosting effect. As a result, since the plateline PL is held at the ground voltage VSS level and the wordline WL is boosted to a voltage higher than the boosting voltage VPP, the boosting voltage VPP corresponding to data level $(11)_2$ is stored in a capacitor FC in each unit cell MC(hidden "1(VPP)" write) (t5).

Next, since data stored in unselected memory cells MC are amplified by the sense amplifier and then latched, the main bitline MBl becomes at a voltage level corresponding to data level stored in each memory cell. A sub-bitline switch signal SBSW1 transits to the boosting voltage VPP, and then the sub-bitline SBL becomes at a voltage level corresponding to data level of the main bitline MBL. As a result, a voltage level corresponding to previously stored data level is re-stored in a capacitor FC in the memory cell MC (t6).

Then, the sub-bitline SBL is precharged to the ground voltage VSS and the main bitline MBL is precharged to the power voltage VCC (t7).

Figure 16:
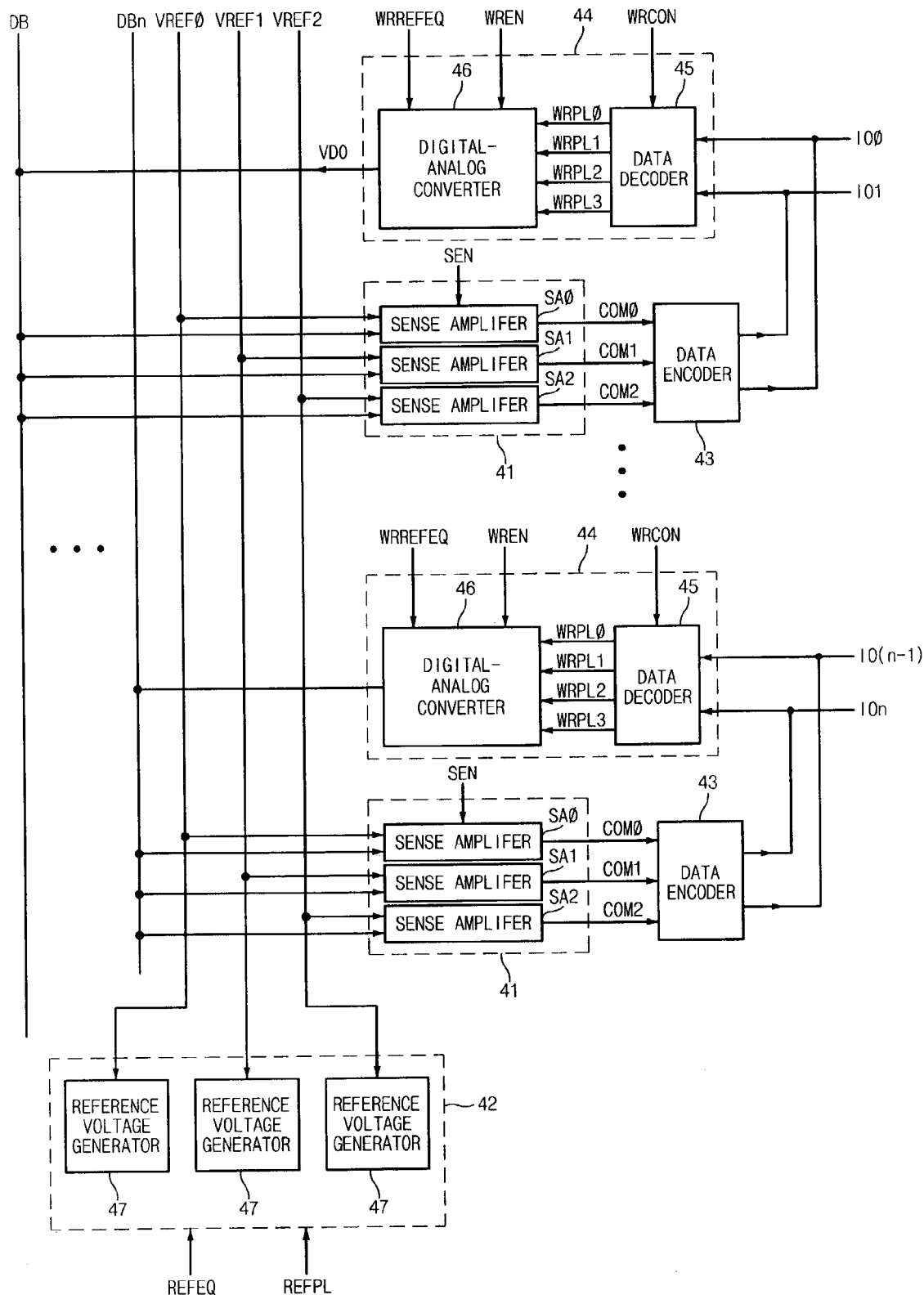
FIG. 16 is a block diagram illustrating a control circuit block of the nonvolatile ferroelectric memory device of FIG. 6.

FIG. 16 is a block diagram illustrating the control circuit block 40 of the nonvolatile ferroelectric memory device of FIG. 6. The control circuit block 40 includes pad and buffers configured to receive external control signals addresses, data and a decoder for decoding addresses and a sense amplifier array block. Here, main structures for data input/output operation are explained, and data of 2 bit is stored in one memory cell. However, a plurality of data having a desired bit may be stored in one memory cell, if necessary.

WRREFEQ is a write reference level equalizing signal, WREN is a write enable signal, WRCON is a write control signal, VDO is a write voltage, WRPL0, WRPL1, WRPL2 and WRPL3 are write decoding signals from the data decoder 45, COM0, COM1 and COM2 are bit values from the data encoder 43 and I01, I0 (n–1) and IOn are input/output lines.

The control circuit block 40 comprises a plurality of sense amplifier array blocks 41, a reference voltage generator array block 42, a plurality of data encoder blocks 43 and a plurality of write control blocks 44. The plurality of sense amplifiers include three sense amplifier SA0, SA1 and SA2 configured to compare a data level voltage transmitted via a data bus DB with a reference voltage and output the comparison result. The reference voltage generator array block includes three reference voltage generators 47 configured to generate reference voltages VREF0, VREF1 and VREF2. The plurality of data encoder blocks 43 encode data levels amplified by the sense amplifiers SA0, SA1 and SA2 of each sense amplifier array block 41 and then output the amplified data levels. The plurality of write control blocks 44 transmit voltages corresponding to inputted data of input/output lines IO into data buses DB.

Here, the write control block 44 has a data decoder 45 and a digital-analog converter DAC 46. The data decoder 45 decodes a data level of input/output bus IO by a thermometer code. The digital-analog converter DAC 46 converts the decoded digital bit into a voltage corresponding to inputted data level, and then outputs the converted data into a data bus DB.

Figure 17:
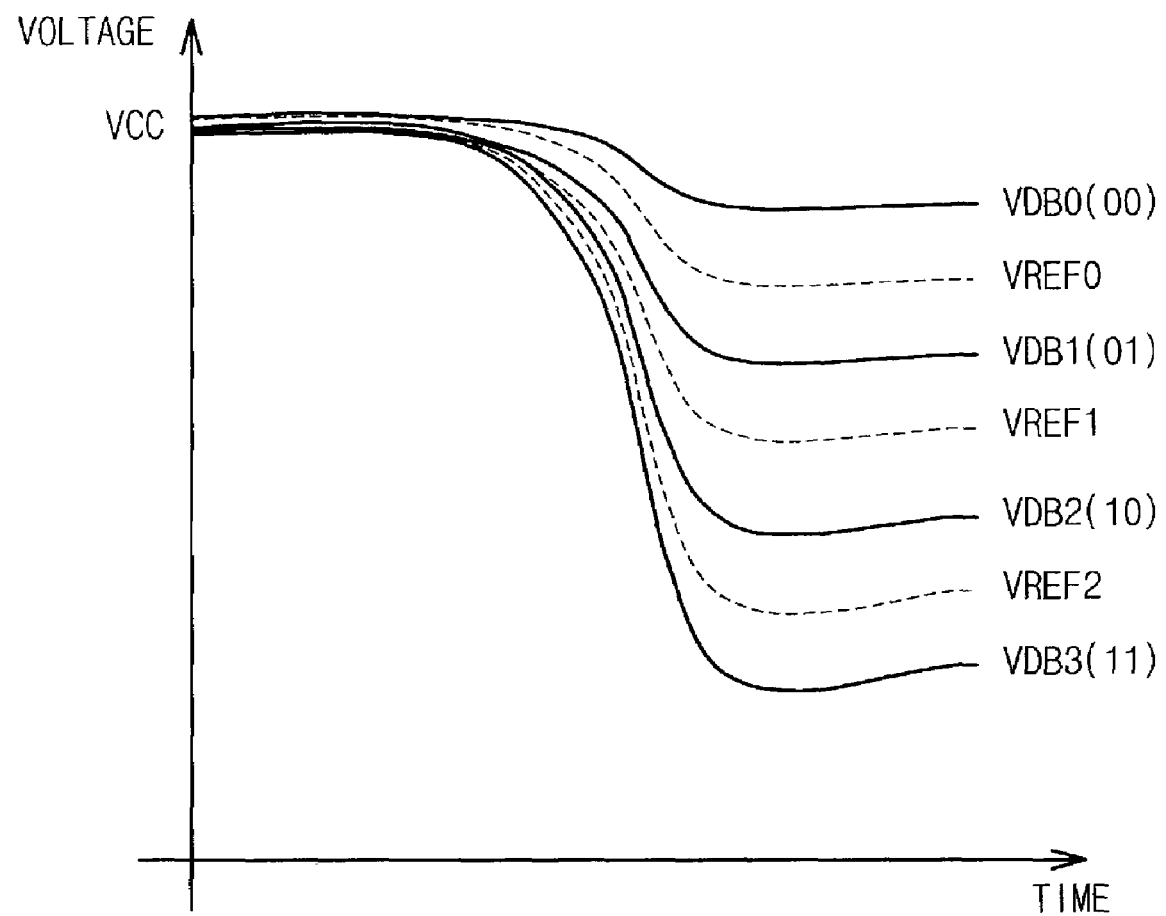
FIG. 17 is a graph illustrating the relation between a data level and a reference voltage in a data bus.

FIG. 17 is a graph illustrating the relation between a data level VDB0 (00). VDB1 (01), VDB2 (10) and VDB3 (11) and a reference voltage VREF0, VREF1 and VREF2 in a data bus.

Figure 18:
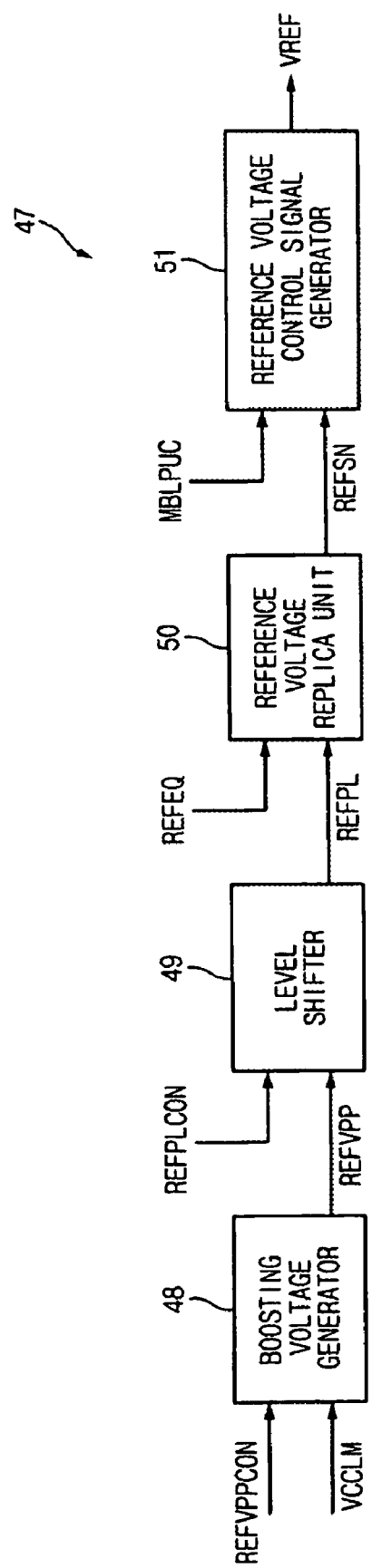
FIG. 18 is a block diagram illustrating a reference voltage generator of FIG. 16.

FIG. 18 is a block diagram illustrating a reference voltage generator of FIG. 16.

REFVPPCON is a reference boosting voltage control signal, VCCLM is a limit voltage of a power voltage VCC, REFEQ is a reference voltage equalizing signal, MPLPUC is a main bitline pull-up control signal, and VREF is a reference voltage.

The reference voltage generator 47 comprises a boosting voltage generator 48, a level shifter 49, a reference voltage control signal generator 50 and a reference voltage replica unit 51. The boosting voltage generator 48 generates a reference boosting voltage REFVPP. The level shifter 49 shifts a level of a reference control signal REFPLCON in response to the reference boosting voltage REFVPP. The reference voltage control signal generator 50 generates a reference voltage control signal REFSN in response to a signal REFPL shifted to a boosting voltage level. The reference voltage replica unit 51 generates a reference voltage VREF under the same condition where data is transmitted from the memory cell MC to the sense amplifier SA.

Figure 19:
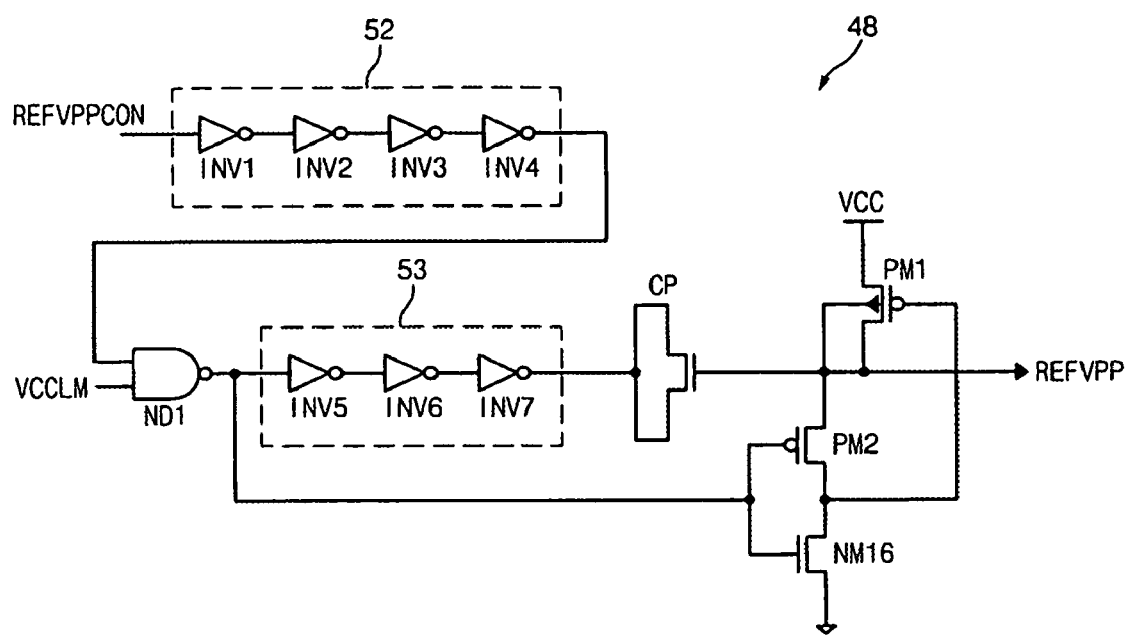
FIG. 19 is a detail circuit diagram illustrating a boosting voltage generator in the reference voltage generator of FIG. 18.

FIG. 19 is a detail circuit diagram illustrating the boosting voltage generator in the reference voltage generator of FIG. 18, REFVPP is a reference boosting voltage.

The boosting voltage generator 48 comprises a non-inverting delay unit 52, an inverting delay unit 53, a pumping capacitor CP, PMOS transistors PM1 and PM2, and a NMOS transistor NM16. The non-inverting delay unit 52 including inverters INV1, INV2, INV3 and INV4 connected in series is configured to delay a reference boosting voltage control signal REFVPPCON for a predetermined time. The inverting delay unit 53 includes a NAND gate ND1 for NANDing a signal delayed by the delay unit 52 and a signal VCCLM for detecting a limit voltage of a power voltage VCC, and inverters INV5, INV6 and INV7 connected in series for delaying an output of the NAND gate ND1 for a predetermined time. The pumping capacitor CP is synchronized to the output of the delay unit 53 and pumps an output terminal. The PMOS transistor PM1 precharges the output terminal. The PMOS transistor PM2 and the NMOS transistor NM16 connected in series between the output terminal and a ground voltage VSS have a gate connected in common to receive the output signal of the NAND gate ND1 and a drain connected in common. A voltage of the drain is applied to a gate of the PMOS transistor PM1.

Figure 20:
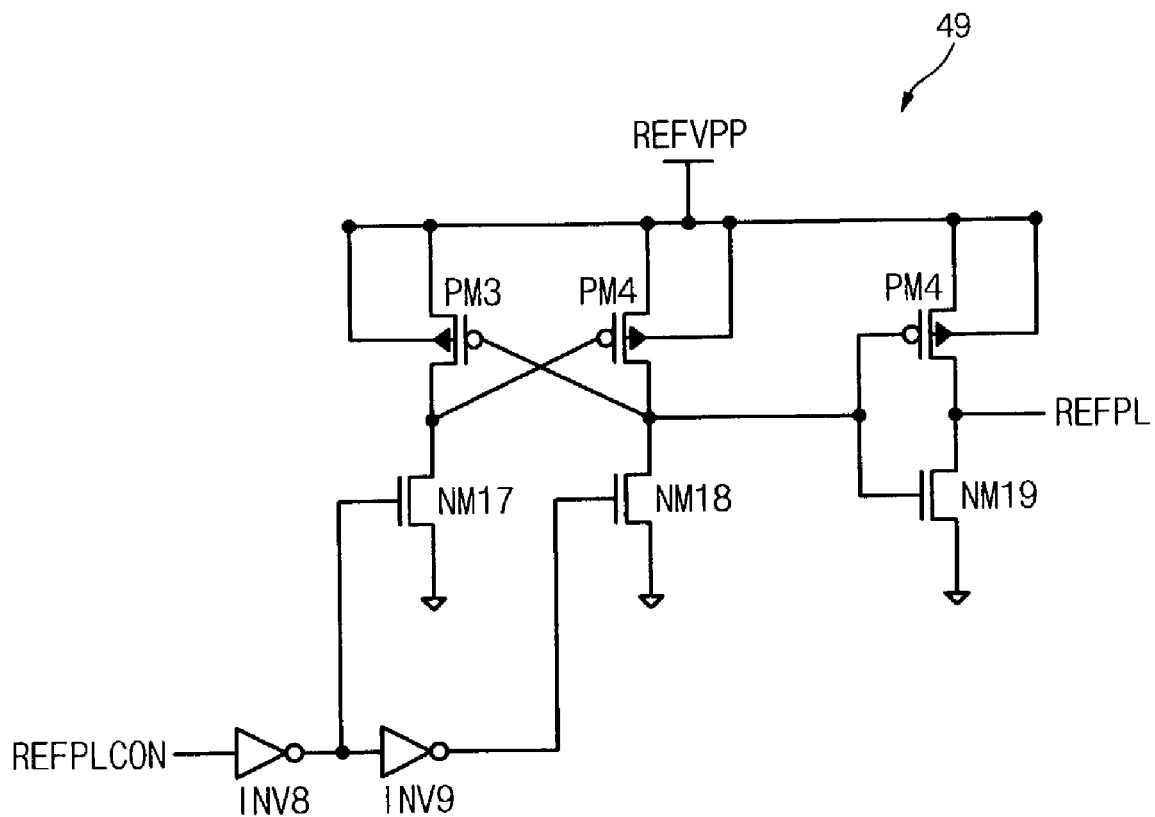
FIG. 20 is a detail circuit diagram illustrating a level shifter in the reference voltage generator of FIG. 18.

FIG. 20 is a detail circuit diagram illustrating the level shifter in the reference voltage generator of FIG. 18.

The level shifter 49 includes inverters INV8 and INV9, PMOS transistors PM3 and PM4, NMOS transistors NM17 and NM18, a PMOS transistor PM5 and a NMOS transistor NM19. The inverters INV8 and INV9 sequentially invert reference control signals REFPLCON. The PMOS transistors PM3 and PM4 have a common-connected source to receive a reference boosting voltage REFVPP and a cross-coupled gate. The NMOS transistor NM17 and NM18 have a drain connected in common to drains of the PMOS transistors PM3 and PM4, respectively. The PMOS transistor PM5 and the NMOS transistor NM19 connected in series between the reference boosting voltage REFVPP and a ground voltage VSS, have a gate connected in common to receive a voltage of a common drain of the PMOS transistor PM4 and the NMOS transistor NM18. An output signal REFPL is outputted from a common drain of the PMOS transistor PM5 and the NMOS transistor NM19.

Figure 21:
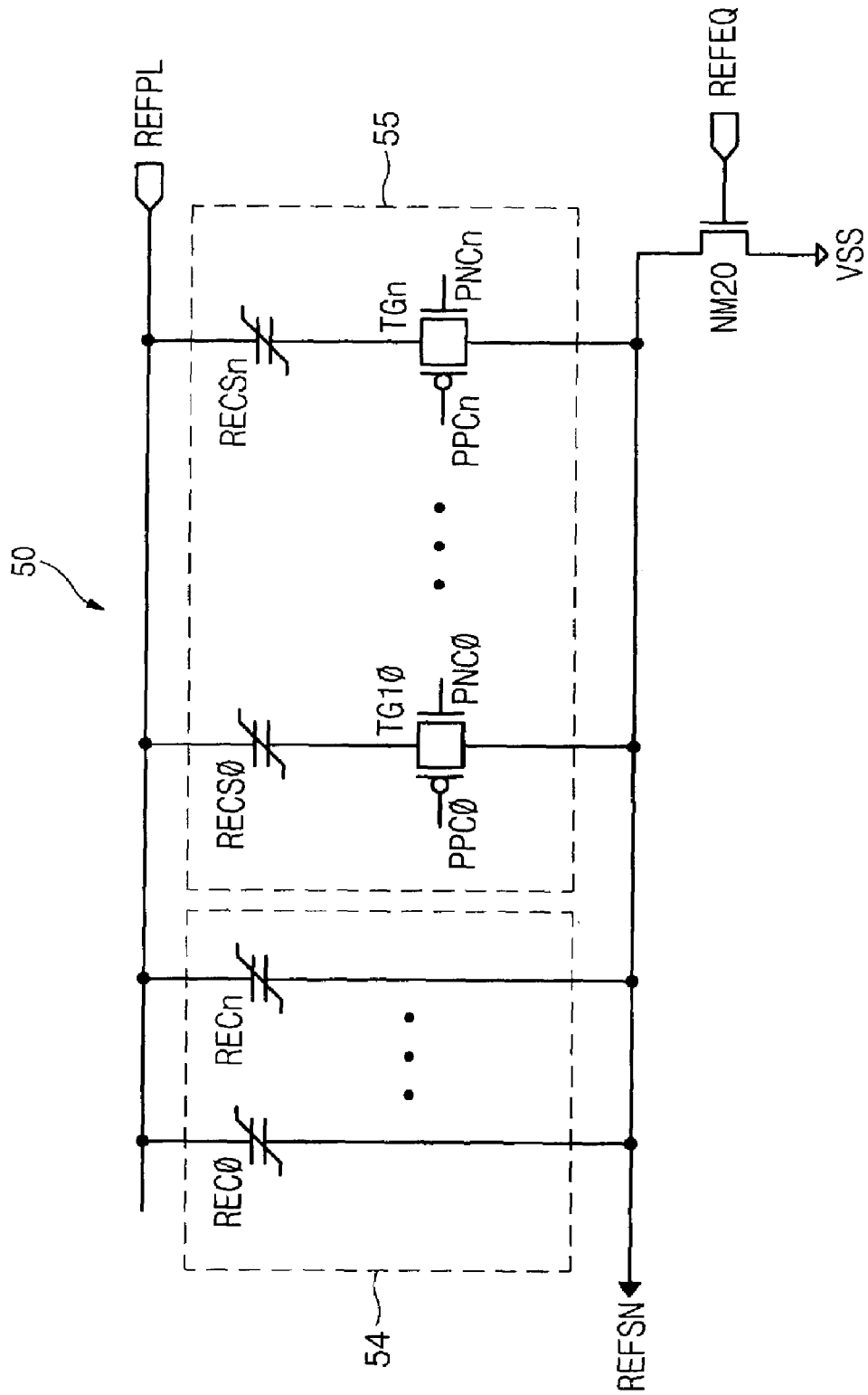
FIG. 21 is a detail circuit diagram illustrating a reference voltage control signal generator in the reference voltage generator.

FIG. 21 is a detail circuit diagram illustrating the reference voltage control signal generator 50 in the reference voltage generator. REFSN is a reference voltage control signal.

The reference voltage control signal generator 50 comprises a main generator 54, a sub-generator 55 and a NMOS transistor NM20. The main generator 54 outputs a predetermined voltage in response to a level-shifted reference control signal REFPL. The sub-generator 55 regulates and outputs a value of fine voltage by transmission control signals PPC0~PPCn and PNC0~PNCn. The NMOS transistor NM20 precharges an output terminal to the ground voltage VSS by a reference voltage equalizing signal REFEQ.

Here, the main generator 54 includes a plurality of ferroelectric reference capacitors REC0~RECn connected in parallel each having a terminal to receive the level-shifted reference control signal REFPL.

The sub-generator 55 includes a plurality of ferroelectric sub-capacitors RECS0~RECSn each having a terminal to receive the level-shifted reference control signal REFPL, and a plurality of transmission gates TG0~TGn configured to selectively transmit voltages charged in the ferroelectric sub-capacitors RECS0~RECSn by control signals PPC0~PPCn and PNC0~PNCn.

Figure 22:
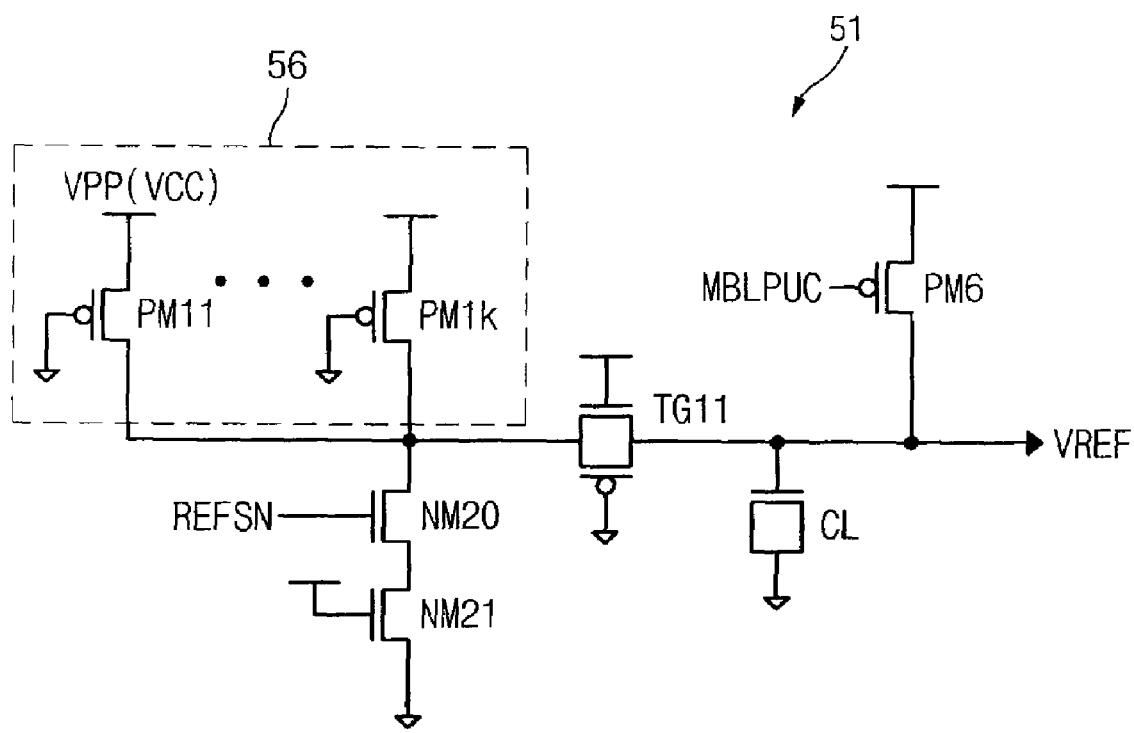
FIG. 22 is a detail circuit diagram illustrating a reference voltage replica unit in the reference voltage generator of FIG. 18.

FIG. 22 is a detail circuit diagram illustrating the reference voltage replica unit 51 in the reference voltage generator of FIG. 18.

The reference voltage replica unit 51 is configured to provide a reference voltage VREF having the same condition in order to transmit data from the memory cell MC to the sense amplifier SA. The reference voltage replica unit 51 comprises a plurality of PMOS transistors PM11~PM1k, NMOS transistors NM20 and NM21, a transmission gate TG11, a PMOS transistor PM6 and a capacitor CL. The plurality of PMOS transistor PM11~PM1k have a gate to receive a ground voltage VSS, a source to receive a boosting voltage VPP or a power voltage VCC and a drain connected in common. The NMOS transistor NM20 connected to a common drain of the PMOS transistors PM11~PM1k has a gate to receive a reference control signal REFSN. The gate is configured to have the same condition as a load condition of the current regulating NMOS transistor NM11 of FIG. 9. The NMOS transistor NM21 has a gate to receive a power voltage VCC. The gate is configured to have the same condition as a load condition of the main bitline pull-down NMOS transistor NM3. The transmission gate TG11 whereto a power voltage VCC and a ground voltage VSS are applied to have the same condition as a load condition of the column selecting unit 30 transmits a voltage of a common drain of the PMOS transistors PM11~PM1k and the NMOS transistor NM6 into an output terminal. The PMOS transistor PM6 has a gate to receive a main bitline pull-up control signal MBLPUC, a source to receive a boosting voltage VPP or a power voltage VCC and a drain connected to an output terminal. The gate is configured to have the same condition as a load condition of the main bitline pull-up controller 13. The capacitor CL is connected between an output configured to have the same condition as a load condition of the data bus DB and the ground voltage VSS.

Figure 23:
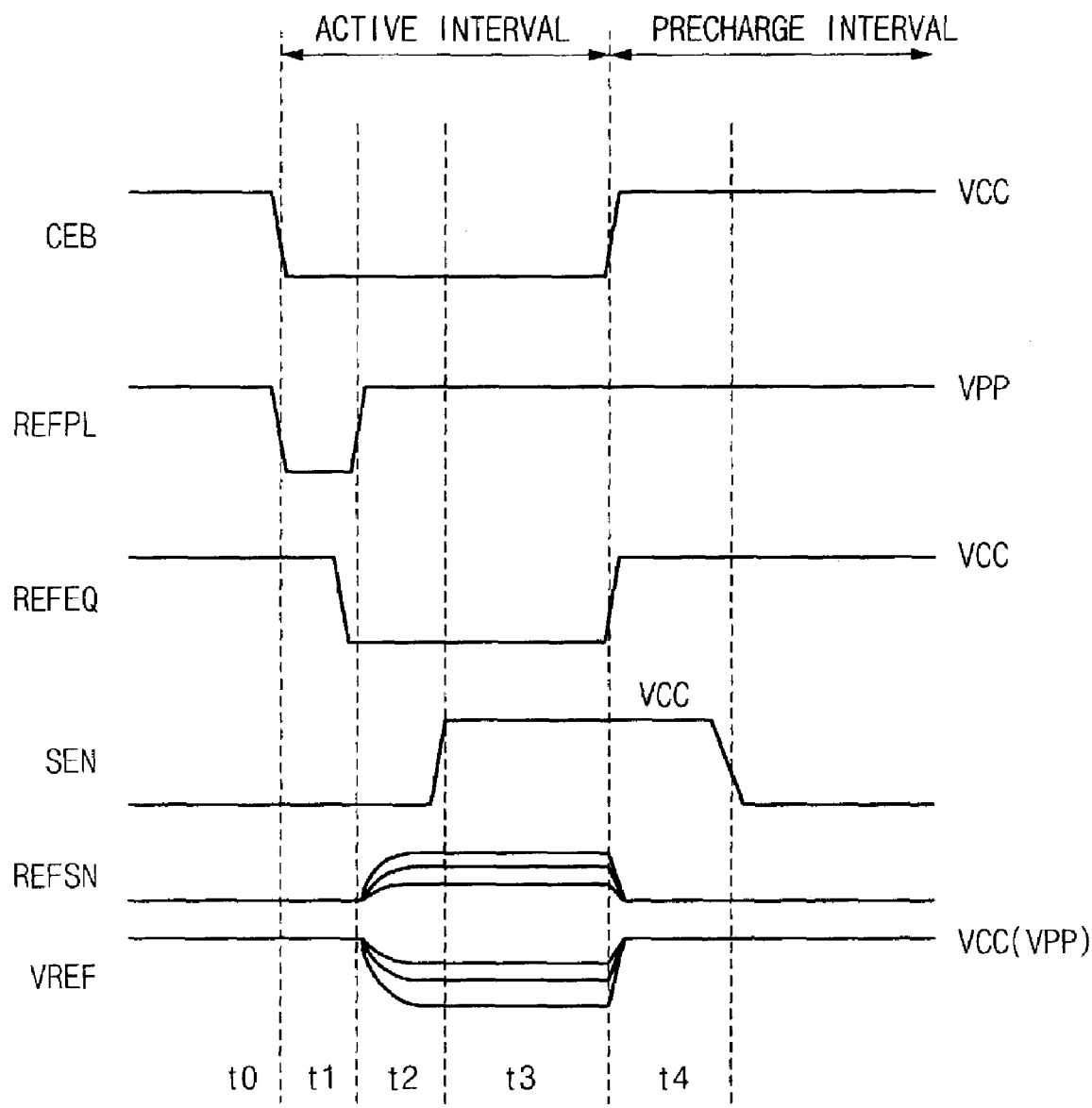
FIG. 23 is a timing diagram illustrating the operation of the reference voltage generator of FIG. 18.

FIG. 23 is a timing diagram illustrating the operation of the reference voltage generator of FIG. 18.

First, if the chip enable signal CEB is enabled to the low level, the level-shifted reference control signal REFPL becomes at the low level. The reference voltage equalizing signal REFEQ is held at the high level, and then the reference voltage control signal REFSN is precharged to the low level. The reference voltage VREF is precharged to the high level (VPP or VCC) (t0, t1).

Next, the level-shifted reference control signal REFPL becomes at the high level to generate the reference voltage VREF corresponding to the reference voltage control signal REFSN (t2, t3).

Here, the level of the reference voltage control signal REFSN programs the number of turned-on transmission gates TG0.about.TGn of the sub-generator 55 so that each reference voltage VREF0, VREF1 and VREF2 may be positioned between voltage levels VDB0, VDB1, VDB2 and VDB3 of the data bus DB(t4).

As a result, the sense amplifier enable signal SEN is enabled to the high level. The sense amplifers SA0, SA1 and SA2 compare voltage levels VDB of the data bus DB in the response to reference voltages VREF0, VREF1 and VREF2. The data encoder 47 encodes comparison results COM1, COM1 and COM2, and then outputs the results into an input/output line.

Figure 24:
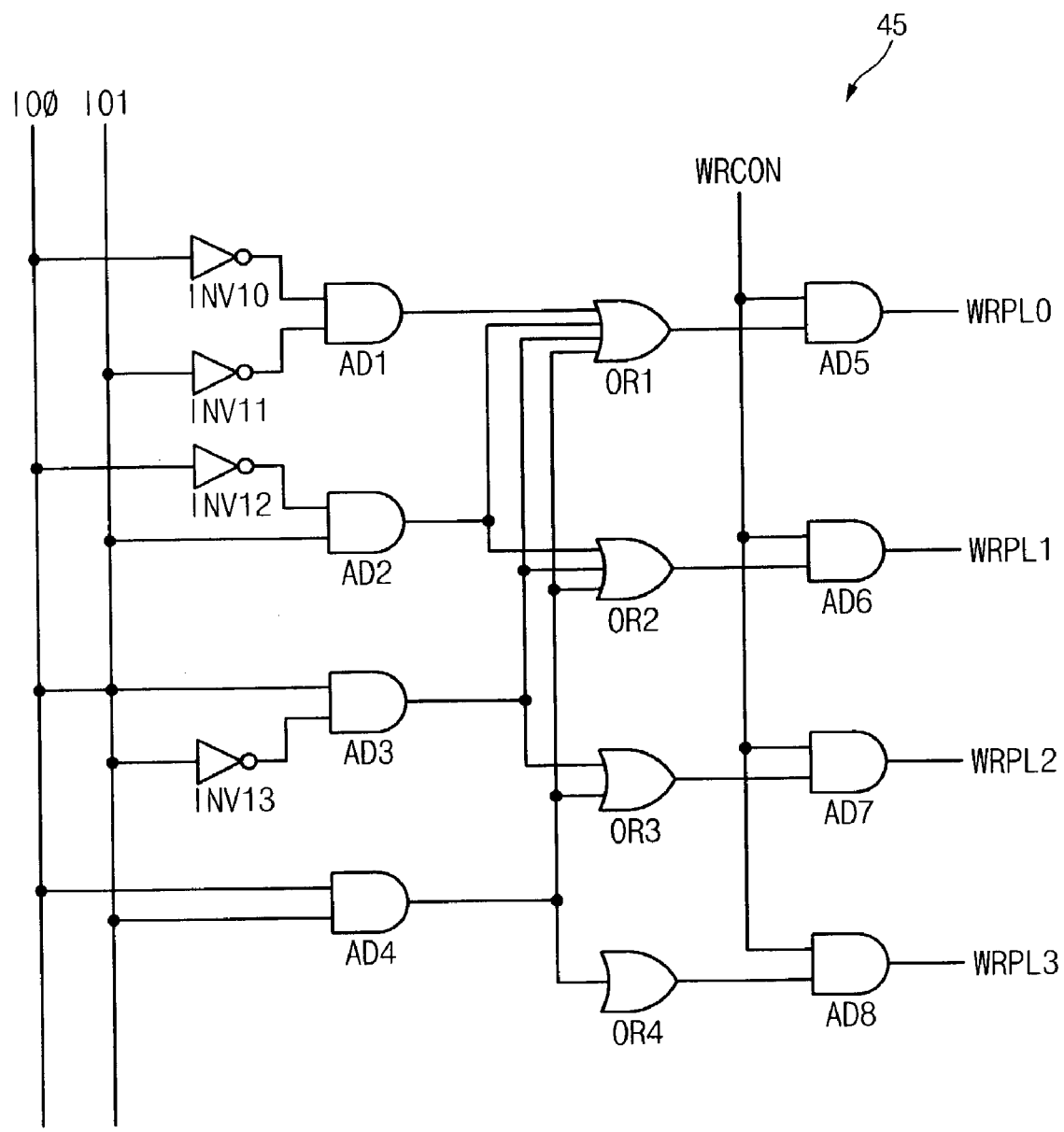
FIG. 24 is a detail circuit diagram illustrating a data decoder in a write control block of FIG. 16.

FIG. 24 is a detail circuit diagram illustrating the data decoder in a write control block of FIG. 16. Here, a thermometer code decoder configured to decode inputted data as a thermometer code is explained for example.

The data decoder 45 comprises AND gates AD1, AD2, AD3 and AD4. The AND gate AD1 ANDs an output signal from an inverter INV10 and an output signal from an inverter INV11. The inverter INV10 inverts data of an input/output line IO0, and the inverter INV11 inverts data of an input/output line IO1. The AND gate AD2 ANDs an output signal from an inverter INV12 and the data of the input/output line IO1. The inverter INV12 inverts data of the input/output line IO0. The AND gate AD3 ANDs the data of the input/output line IO0 and an output signal from an inverter INV13. The inverter INV13 inverts the data of the input/output line IO1. The AND gate AD4 ANDs the data of the input/output lines IO0 and IO1.

The data decoder 45 comprises OR gates OR1, OR2, oR3 and OR4. The OR gate OR1 ORs output signals from the AND gates AD1, AD2, AD3 and AD4. The OR gate OR2 ORs output signals from the AND gates AD2, AD3 and AD4. The OR gate OR3 ORs output signals from the AND gates AD3 and AD4. The OR gate OR4 Ors an output signal from the AND gate AD4.

The data decoder 45 comprises AND gates AD5, AD6, AD7 and AD8 configured to transmit output signals from the OR gates OR1, OR2, OR3 and OR4 in response to a write control signal WRCON and output decoding signals WRPL0, WRPL1, WRPl2 and WRPL3, respectively.

As a result, the decoding signals WRPL0, WRPL1, WRPL2 and WRPL3, which are thermometer codes of the data decoder 45, become (1000) if inputted data is (00), (1100) if (01), (111) if (10), and (1111) if (11).

Figure 25:
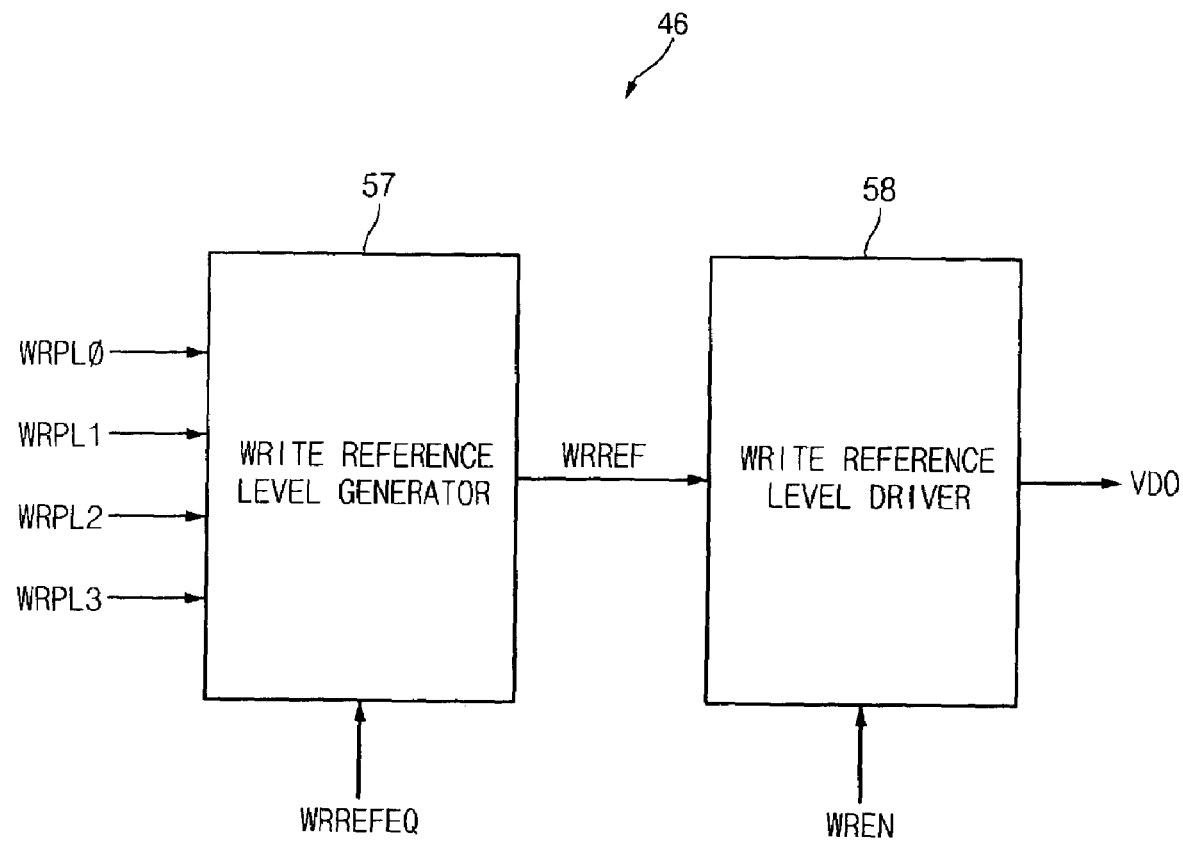
FIG. 25 is a block diagram illustrating a digital-analog converting unit in the write control block of FIG. 16.

FIG. 25 is a block diagram illustrating the digital-analog converting unit in the write control block of FIG. 16. WRREFEO is a write reference level equalizing signal, and WREN is a write enable signal.

The digital-analog converter 46 comprises a write reference level generator 57 and a write reference level driver 58. The write reference level generator 57 is configured to receive the write decoding signals WRPL0, WRPL1, WRPL2 and WRPL3, which are thermometer codes of the data decoder 45, and generate a write reference level WRREF. The write reference level driver 58 is configured to drive a write voltage VDO corresponding to the write reference level WRREF and transmits the voltage into the data bus DB0.

Figure 26:
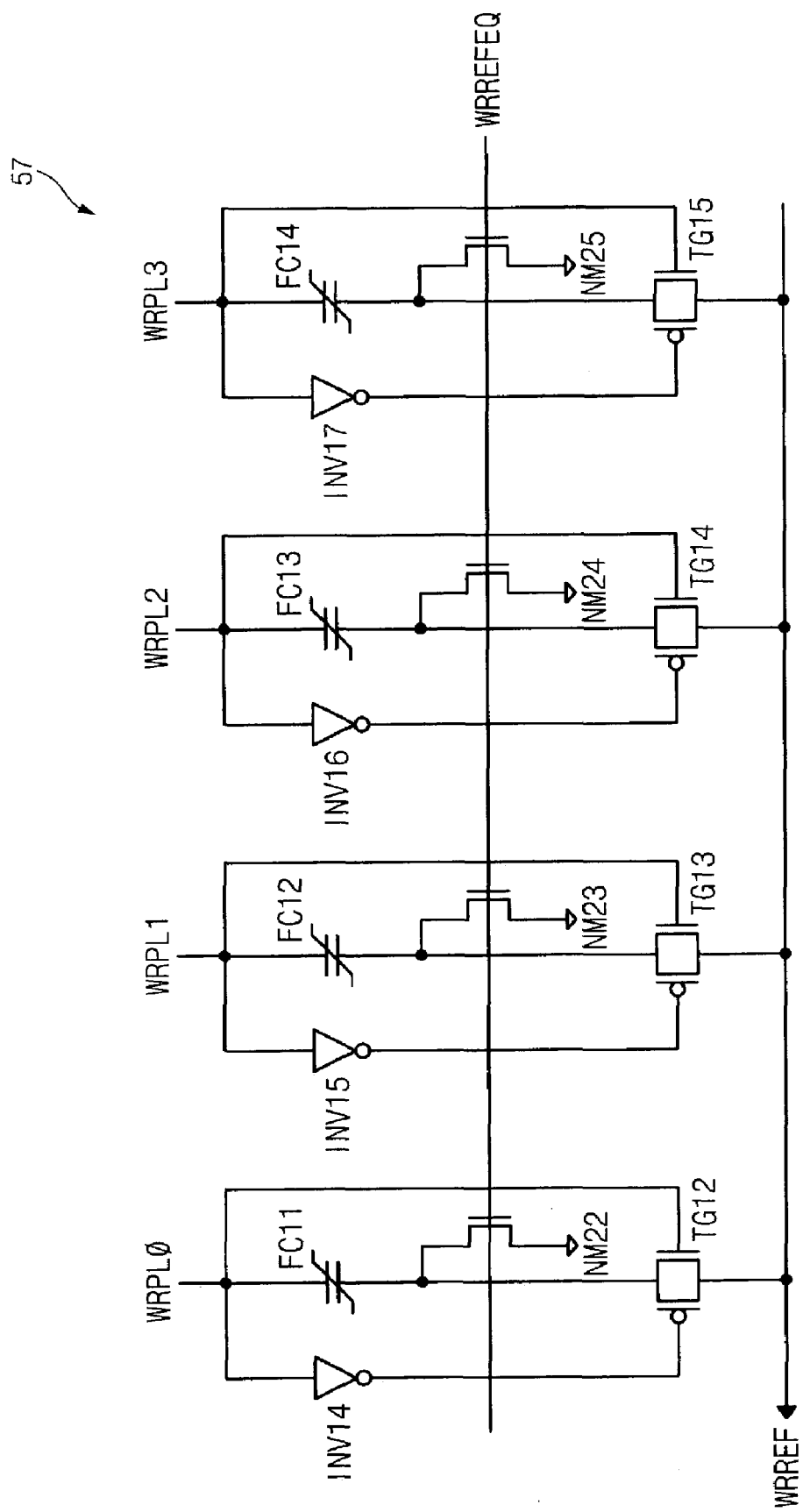
FIG. 26 is a detail circuit diagram illustrating a write reference level generator in the digital-analog converting unit of FIG. 25.

FIG. 26 is a detail circuit diagram illustrating the write reference level generator 57 in the digital-analog converting unit of FIG. 25.

The write reference level generator 57 comprises ferroelectric capacitors FC11, FC12, FC13 and FC14, transmission gates TG12, TG13, TG14 and TG15, and NMOS transistors NM22, NM23, NM24 and NM25. The ferroelectric capacitors FC11, FC12, FC13 and FC14 each have a terminal to receive the write decoding signal WRPL0, WRPL1, WRPL2 and WRPL3. The transmission gate TG12, TG13, TG14 and TG15, each controlled by the write decoding signal WRPL0, WRPL1, WRPL2 and WRPL3 and signals inverted by inverters INV14, INV15, INV16 and INV17, selectively transmit potentials charged in the ferroelectric capacitors FC11, FC12, FC13 and FC14. The NMOS transistors NM22, NM23, NM24 and NM25, controlled by a write reference level equalizing signal WRREFEQ, set up output terminals of the capacitors FC11, FC12, FC13 and FC14 at a ground voltage. The potentials charged in the capacitors FC11, FC12, FC13 and FC14, which are selectively transmitted by the transmission gate TG12, TG13, TG14 and TG15, are connected in common to an output terminal to output the write reference level WRREF.

Figure 27:
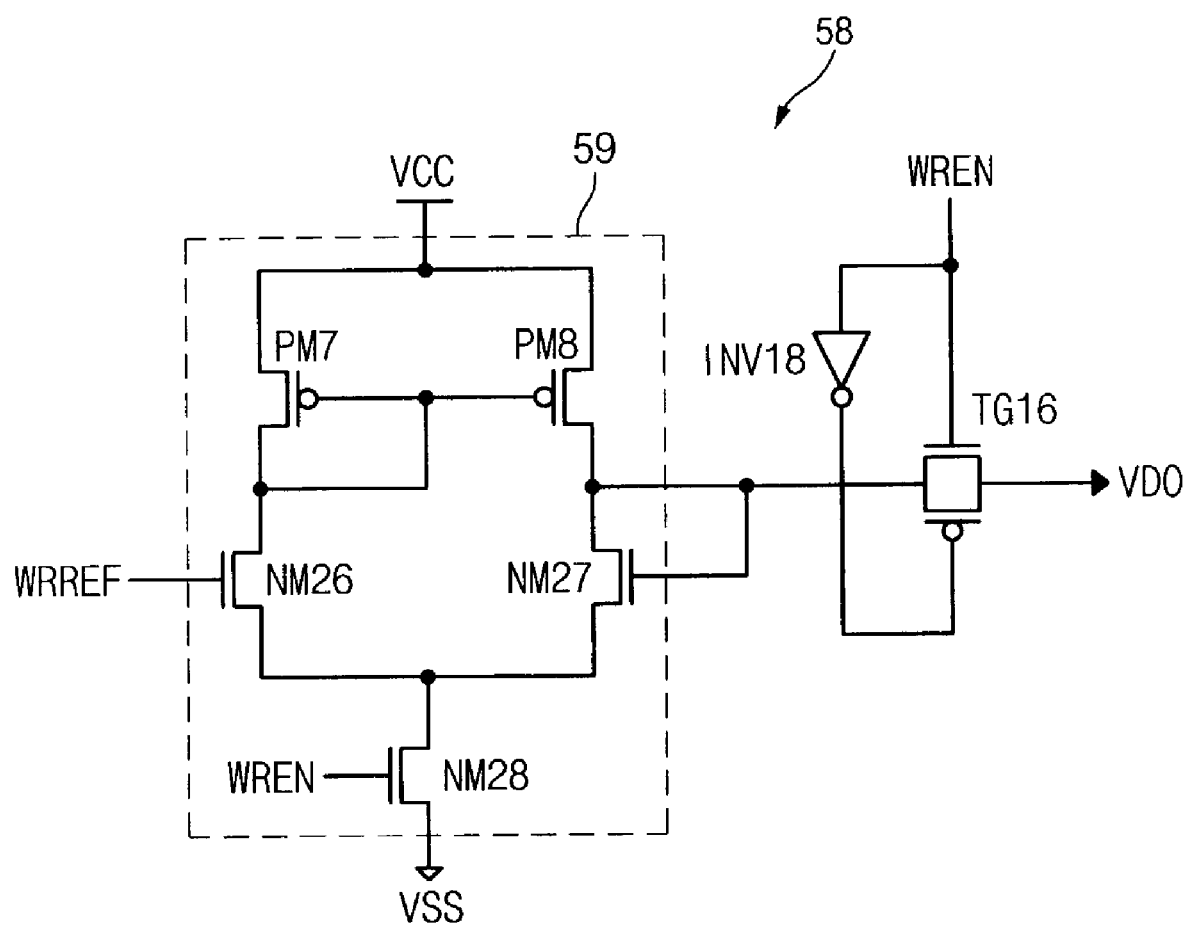
FIG. 27 is a detail circuit diagram illustrating a write reference level driver in the digital-analog converting unit of FIG. 25.

FIG. 27 is a detail circuit diagram illustrating the write reference level driver 58 in the digital-analog converting unit of FIG. 25.

The write reference level driver 58 comprises a differential amplifier 59 and a transmission gate TG16. The differential amplifier 59 compares the write reference level WRREF and a potential of an output terminal. The transmission gate TG16 selectively transmits an output potential VDO from the differential amplifier 59 into the data bus DB0 according to a write enable signal WREN and a signal inverted by an inverter INV18.

Here, the differential amplifier 49 includes PMOS transistors PM7 and PM8, NMOS transistors NM26 and NM27, and a NMOS transistor NM28. The PMOS transistors PM7 and PM8 have a common source to receive the power voltage VCC, a gate connected in common to a drain. The NMOS transistors NM26 and NM27 have a drain connected in common to a drain of the PMOS transistors PM7 and PM8 and a gate connected to the write reference level VREF and an output. terminal, respectively. The NMOS transistor NM28 has a source connected to the ground voltage VSS and a gate to receive the write control signal WREN.

The operation of control circuit block 40 in the nonvolatile FRAM is as follows.

In a write mode, the sense amplifiers SA0, SA1 And SA2 output bit values COM1, COM1 and COM2and VREF2 to represent which data levels, shown in FIG. 17, the data level VDB of the data bus DB falls to by using reference voltages VREF0, VREF1.

The data encoder 43 encodes the bit values COM1, COM1 and COM2, which are comparison result of the sense amplifiers SA0, SA1 and SA2, and then externally outputs bit values of corresponding data levels via intput/output lines IO0 and IO1.

For example, when the voltage VBD2 corresponding to the data level (10) is carried in the data bus DB0, the output value COM0 of the sense amplifier SA0 becomes a low level (0) because the reference voltage VREF0 is higher than the voltage VBD2 of data in the data bus DB0. The output value COM1 of the sense amplifier SA1 becomes a low level (0) because the reference voltage VREF1 is higher than the voltage VBD2 of data in the data bus DB0. The output value COM2 of the sense amplifier SA2 becomes a high level (1) because the reference voltage VREF2 is lower than the voltage VBD2 of data in the data bus DB2.

The data encoder 43 encodes an output value (001) of the sense amplifiers SA0, SA1 and SA2, and then outputs the data level (10) into the input/output lines IO0 and IO1.

In a write mode, data is externally inputted via a data pad and then carried in the input/output lines IO0 and IO1.

The write control block 44 converts data of the input/output lines IO0 and IO1 into corresponding voltages, and then transmits the converted voltages into the data bus DB0. In other words, data of the input/output lines IO0 and IO1 are decoded by the data decoder 45, converted into corresponding voltages by the digital-analog converter 46, and then transmitted into the data bus DB0.

For example, when the data (10) is carried in the input/output lines IO0 and IO1, the data decoder 45 decodes the inputted data (10) into a thermometer code value (1110). Then, the digital-analog converter 46 generates the voltage VD0 corresponding to the thermometer code value (1110), and then transmits the voltage into the data bus DB0. As a result, the level of the data bus DB0 is set up at the transmitted voltage value VDO.

Figure 28:
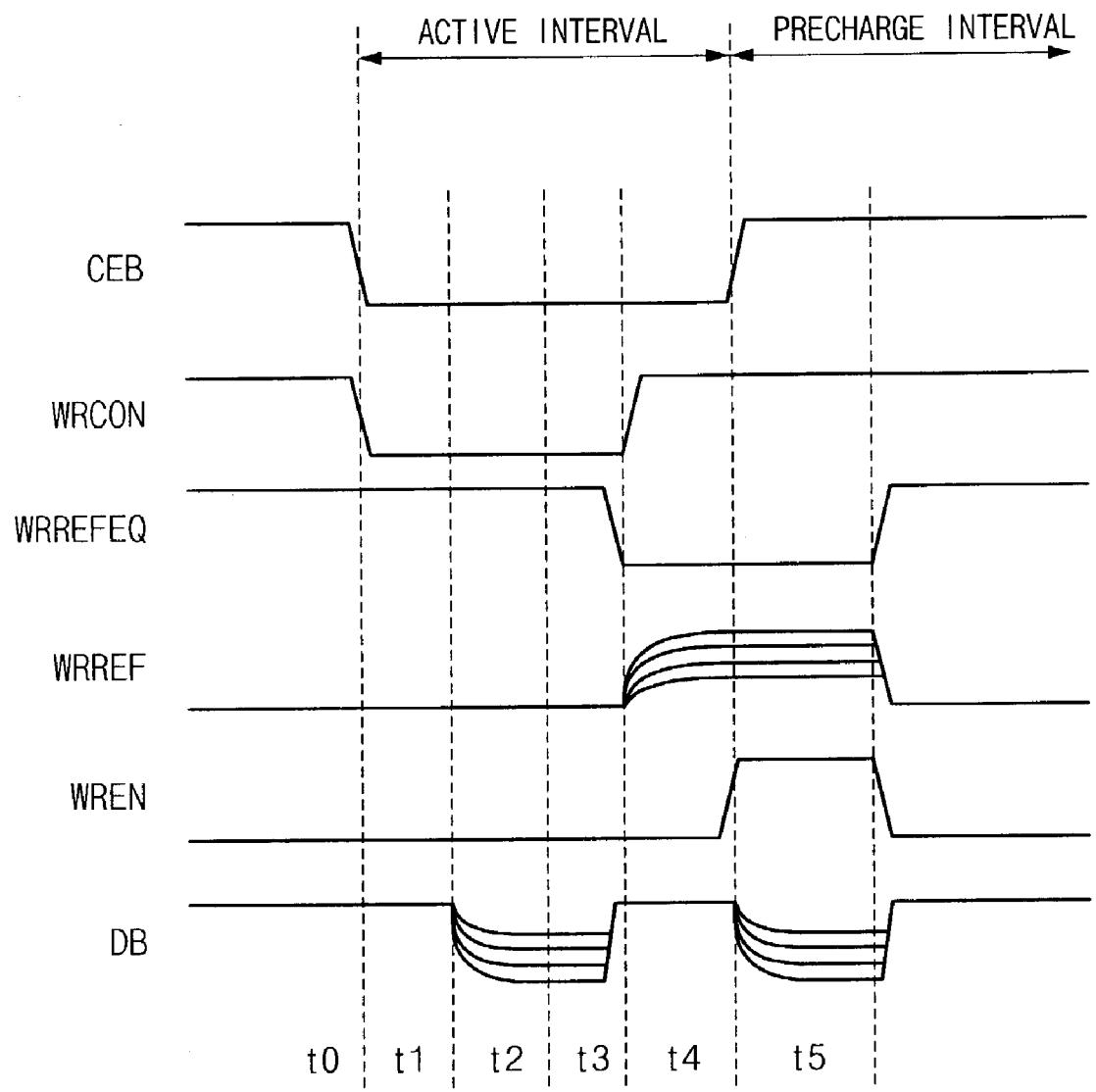
FIG. 28 is a timing diagram illustrating the operation of the write control block in the control circuit block of FIG. 16.

FIG. 28 is a timing diagram illustrating the operation of the write control block in the control circuit block of FIG. 16.

First, it the chip enable signal CEB transits to a low level and then enabled, the write control signal WRCON becomes at a low level. The write reference level equalizing signal WRREFEQ is held at a high level, and the write reference level WRREF is initially set up at a low level (t0, t1, t2, t3). Here, data stored in the memory cell MC is re-stored in the data bus DB (t2 and t3).

Subsequently, the write control signal WRCON becomes at a high level. The data decoder 45 decodes data of the input/output lines IO0 and IO1 into the write decoding signals WRPL0, WRPL1, WRPL2 and WRPL3 which are thermometer codes.

The write decoding signals WRPL0, WRPl1, WRPL2 and WRPL3 of the data decoder 45 are applied to the digital-analog converter 46 to generate the voltage VDO corresponding to inputted data. The capacitors FC11, FC12, FC13 among four capacitors FC11, FC12, FC13 and FC14 of the write reference level generator 47 are only driven by the thermometer codes WRPL0, WRPL1, WRPL2, WRPL3 (111) corresponding to inputted data (10) to generate the write reference level WRREF corresponding to the inputted data (10) (t4)

Accordingly, if the write enable signal WREN is enabled to a high level, the write reference level driver 48 drives the voltage VDO corresponding to the write reference level VRREF and transmit the voltage into the data bus DB (t5).

As discussed earlier, the disclosed nonvolatile ferroelectric memory device is configured to store a plurality of data levels in one memory cell, thereby improving degree of integration of the memory device and securing the stable operation.

In a write operation, after high data is stored, the stored data level is regulated by using a voltage corresponding to an inputted data level. As a result, the write operation is stably performed.

Additionally, the disclosed FRAM can operate with the minimum line load due to its bitline structure including a main bitline and a sub-bitline. As a result, sensing sensitivity and operation speed are improved.

Finally, a plurality of reference voltages used in a sense amplifier can be minutely programmed due to linear charge effect of a ferroelectric capacitor.

Many changes and modifications to the embodiments described herein could be made. The scope of some changes is discussed above. The scope of others will become apparent from the appended claims.

What is claimed is:

1. A nonvolatile ferroelectric memory device which can read/write a plurality of data levels from/to ferroelectric memory cells including:
    a control circuit block positioned in a middle of the memory device and configured to read/write data from/to the ferroelectric memory cells;
    a data bus arranged between a plurality of memory cell arrays each comprising the ferroelectric memory cells wherein the data bus is positioned vertical to the control circuit block;
    said control circuit block including,
        a read control block configured to convert the data level voltage stored in the ferroelectric memory cell into a corresponding multi-bit data and output the multi-bit data externally; and
        a write control block configured to receive the multi-bit data inputted externally and write a corresponding voltage level to the multi-bit data into the ferroelectric memory cell.

2. The device according to claim 1, wherein in operation of writing data level in the ferroelectric memory cell, a most significant data level voltage is stored and a corresponding data level voltage is applied to regulate a data level voltage of the memory cell.

3. The device according to claim 2, wherein:
    in a write operation, a data level voltage corresponding to a multi-bit data is stored in the ferroelectric memory cell; and
    in a read operation, the multi-bit data corresponding to the data level voltage stored in the ferroelectric memory cell is outputted externally.

4. The device according to claim 3, wherein the data level voltage corresponding to the multi-bit data inputted externally is stored in the ferroelectric memory cell via a main bitline and a sub-bitline.

5. The device according to claim 3, wherein the data level voltage stored in the ferroelectric memory cell is compared with a reference voltage and is converted into the multi-bit data to be outputted.

6. The device according to claim 1, wherein a main bitline is precharged to a high level and a sub-bitline is precharged to a low level.

7. A nonvolatile ferroelectric memory device comprising layered bitlines consisting of main bitline and sub-bitline, which can write and read a plurality of data levels in a ferroelectric memory cell by reducing a current value corresponding to a sensing voltage of the sub-bitline at an initial level of the main bit line, including:
a read control block configured to convert the data level voltage stored in the ferroelectric memory cell into a corresponding multi-bit data and output the multi bit data externally;
and a write control block configured to receive the multi-bit data inputted externally and write a corresponding voltage level to the multi-bit data into the ferroelectric memory cell;
said read control block including,
a sense amplifier array including a plurality of sense amplifiers configured to compare the data level voltage stored in the ferroelectric memory cell with a plurality of reference voltages, respectively, and output the comparison result;
a reference voltage generator array including a plurality of reference voltage generators configured to generate the plurality of reference voltages;
a data encoder configured to encode signals outputted from the plurality of sense amplifiers and output corresponding data;
said write control block including,
a data decoder configured to decode data inputted externally; and
a digital-to-analog converter configured to generate a data level voltage corresponding to the data by using the decoded bit value.

8. The device according to claim 7, further comprising a plurality of sub-memory cell array blocks each consisting of the ferroelectric memory cells,
wherein each sub-memory cell array block includes a plurality of main bitlines and a plurality of unit sub-memory cell array,
wherein the unit sub memory cell array includes a sub-bitline connected to the ferroelectric memory cells.

9. The device according to claim 8, comprising a current regulator configured to set a potential of the main bitline by a sensing data level voltage carried in the sub-bitline at the sensing data level voltage.

10. The device according to claim 9, wherein the current regulator comprises a transistor having a gate connected to the sub-bitline and being connected between the main bitline and a ground voltage.

11. The device according to claim 8, further comprising a pull-up means configured to pull up the sub-bitline to a boosting voltage.

12. The device according to claim 11, wherein the pull-up means comprises a transistor having a gate to receive a pull-up control signal and being connected between a terminal of a pull-up signal and the sub-bitline.

13. The device according to claim 12, wherein the pull-up signal transits to a boosting voltage, when a predetermined time elapses after the pull-up control signal transits to the boosting voltage.

14. The device according to claim 8, further comprising a switching means configured to interconnect the sub-bitline with the main bitline during a restoration and write operation.

15. The device according to claim 14, wherein the switching means is controlled by a control signal enabled to a boosting voltage during the restoration and write operation.

16. The device according to claim 8, further comprising a plurality of load controllers configured to control the main bitline to have a predetermined load value.

17. The device according to claim 16, wherein the load controller comprises a transistor connected to the main bitline at a predetermined interval to receive a power voltage.

18. The device according to claim 17, wherein the transistor is operated as a resistance device when turned on.

19. The device according to claim 7, wherein, in writing, a data level voltage in the ferroelectric memory cell, a most significant data level voltage is stored and a data level voltage corresponding to inputted data is applied to regulate a data level voltage of the ferroelectric memory cell.

20. The device according to claim 7, wherein the reference voltage generator comprises a plurality of ferroelectric capacitors each connected between a terminal of a boosting voltage and an output terminal.

21. The device according to claim 20, wherein the reference voltage generator further comprises a voltage level variable means configured to regulate a voltage level of the reference voltage.

22. The device according to claim 21, wherein the voltage level variable means comprises a plurality of transmitters configured to be controlled by programmed control signals for setting up voltage level and selectively output voltages charged in a predetermined number of ferroelectric capacitors among the plurality of ferroelectric capacitors.

23. The device according to claim 7, wherein the reference voltage generator further comprises a pull-down means configured to set up an output terminal of the reference voltage generator at a ground voltage in an interval when the cell does not operate.

24. The device according to claim 7, wherein the reference voltage generator further comprises a load replica means configured to generate a reference voltage having the same condition as a load condition where the data level voltage stored in the memory cell is transmitted to the sense amplifier.

25. The device according to claim 20, wherein the boosting voltage is initially set up at a ground voltage during a predetermined interval.

26. The device according to claim 7, wherein the plurality of reference voltages are set up at levels of voltages between data level voltages able to be stored in the memory cell.

27. The device according to claim 7, wherein the data decoder comprises a thermometer code decoder configured to decode the data into a thermometer code bit.

28. The device according to claim 7, wherein the data decoder is controlled by a write control signal.

29. The device according to claim 7, wherein the digital-analog converter comprises:
a data level voltage generator configured to generate a data level voltage corresponding to the data by using the decoded bit value; and
a driver configured to drive the data level voltage.

30. The device according to claim 29, wherein the data level voltage generator comprises a plurality of ferroelectric capacitors each having one terminal to receive the decoded bit value and the other terminal connected to an output terminal in common.

31. The device according to claim 30, wherein the data level voltage generator comprises a plurality of transmitters configured to be connected between the other terminal and an output terminal of the plurality of ferroelectric capacitors and controlled by the decoded bit value and selectively transmit charges stored in the plurality of ferroelectric capacitors into the output terminal.

32. The device according to claim 30, wherein the data level voltage generator further comprises a pull-down means configured to set up the other terminal of the ferroelectric capacitor at a ground voltage.

33. The device according to claim 29, wherein the driver comprises a level setup means configured to set up potentials of the data level voltage and the output terminal at the same potential.

34. The device according to claim 7,
wherein the reference voltage generator comprises:
a boosting voltage generator configured to generate a boosted reference boosting voltage by using a power voltage;
a level shifter configured to shift a level of a reference control signal by using the reference boosting voltage;
a reference voltage control signal generator configured to generate a reference voltage control signal by using a reference control signal shifted to the reference boosting voltage level; and
a reference voltage replica means configured to generate the reference voltage under the same condition where data is transmitted from the memory cell to the sense amplifier by using the reference voltage control signal.

35. The device according to claim 34, wherein the reference voltage control signal generator comprises a plurality of ferroelectric capacitors each connected between a terminal of a boosting voltage and an output terminal, and a voltage level variable means configured to regulate a voltage level of the reference voltage.

36. The device according to claim 35, wherein the voltage level variable means comprises a plurality of transmitters configured to be controlled by programmed control signals for setting up voltage levels and selectively transmit voltages charged in a predetermined number of ferroelectric capacitors among the plurality of ferroelectric capacitors.

37. The device according to claim 34, wherein the reference voltage generator further comprises a pull-down means configured to set up an output terminal of the reference voltage generator at a ground voltage during an interval where the cell does not operate.

38. The device according to claim 34, wherein the reference boosting voltage is initially set up at a ground voltage during a predetermined interval.

39. The device according to claim 34, wherein the plurality of reference voltages are set up at levels of voltages between data level voltages able to be stored in the ferroelectric memory cell.

* * * * *